US009172370B2

(12) United States Patent
Ikeda et al.

(10) Patent No.: US 9,172,370 B2
(45) Date of Patent: Oct. 27, 2015

(54) SEMICONDUCTOR DEVICE

(71) Applicant: Semiconductor Energy Laboratory Co., Ltd., Atsugi-shi, Kanagawa-ken (JP)

(72) Inventors: Takayuki Ikeda, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1 day.

(21) Appl. No.: 14/096,457

(22) Filed: Dec. 4, 2013

(65) Prior Publication Data

US 2014/0159771 A1 Jun. 12, 2014

(30) Foreign Application Priority Data

Dec. 6, 2012 (JP) ................................ 2012-266911
Sep. 12, 2013 (JP) ................................ 2013-189029

(51) Int. Cl.
*H01L 25/00* (2006.01)
*H03K 19/00* (2006.01)
*H03K 19/177* (2006.01)

(52) U.S. Cl.
CPC ........ *H03K 19/0016* (2013.01); *H03K 19/1776* (2013.01); *H03K 19/17772* (2013.01)

(58) Field of Classification Search
CPC .................. H03K 19/17736; H03K 19/17728; H03K 19/17704
USPC ................................................ 326/37–41, 47
See application file for complete search history.

(56) References Cited

U.S. PATENT DOCUMENTS 4,609,986 A 9/1986 Hartmann
4,642,487 A 2/1987 Carter
4,870,302 A 9/1989 Freeman
5,343,406 A 8/1994 Freeman
5,432,719 A 7/1995 Freeman
5,488,316 A 1/1996 Freeman
5,731,856 A 3/1998 Kim et al.

(Continued)

FOREIGN PATENT DOCUMENTS

EP 1 737 044 A1 12/2006
EP 2 226 847 A2 9/2010

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Jason M Crawford
(74) *Attorney, Agent, or Firm* — Fish & Richardson P.C.

(57) ABSTRACT

A programmable logic device (PLD) that can control whether to supply power in each logic element is provided. The PLD includes at least a programmable logic element, a terminal to which a potential is input from an external power source, a switch controlling conduction between the terminal and the logic element, and a memory outputting a control signal for setting the conduction state of the switch. The memory stores pieces of configuration data for setting the conduction state of the switch. Any one of the pieces of configuration data is output as the control signal from the memory to the switch.

20 Claims, 25 Drawing Sheets

(56) References Cited

U.S. PATENT DOCUMENTS

| | | | |
|---|---|---|---|
| 5,744,864 | A | 4/1998 | Cillessen et al. |
| 6,127,702 | A | 10/2000 | Yamazaki |
| 6,172,521 | B1 | 1/2001 | Motomura |
| 6,294,274 | B1 | 9/2001 | Kawazoe et al. |
| 6,535,422 | B2 | 3/2003 | Goto |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,098,689 | B1 | 8/2006 | Tuan |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,797,664 | B2 | 9/2010 | Matsumoto |
| 7,973,556 | B1 * | 7/2011 | Noguera Serra et al. ....... 326/38 |
| 7,986,160 | B2 * | 7/2011 | Hoang et al. .................... 326/30 |
| 8,072,237 | B1 | 12/2011 | Rahim |
| 8,547,753 | B2 | 10/2013 | Takemura |
| 8,675,382 | B2 | 3/2014 | Kurokawa |
| 8,891,281 | B2 | 11/2014 | Kurokawa |
| 8,970,251 | B2 | 3/2015 | Kurokawa |
| 9,007,093 | B2 | 4/2015 | Kurokawa et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2007/0300201 | A1 | 12/2007 | Matsumoto |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0148171 | A1 | 6/2010 | Hayashi |
| 2010/0148820 | A1 * | 6/2010 | Nishioka ......................... 326/39 |
| 2011/0101351 | A1 | 5/2011 | Yamazaki |
| 2011/0175646 | A1 | 7/2011 | Takemura |
| 2012/0212995 | A1 | 8/2012 | Kurokawa |
| 2012/0293200 | A1 | 11/2012 | Takemura |
| 2012/0293201 | A1 | 11/2012 | Fujita |
| 2012/0293202 | A1 | 11/2012 | Nishijima |
| 2012/0293206 | A1 | 11/2012 | Yoneda |
| 2012/0293209 | A1 | 11/2012 | Takewaki |
| 2012/0293242 | A1 | 11/2012 | Kato |
| 2013/0207170 | A1 | 8/2013 | Kurokawa |
| 2013/0285697 | A1 | 10/2013 | Kurokawa |
| 2013/0314124 | A1 | 11/2013 | Ikeda et al. |
| 2014/0035618 | A1 * | 2/2014 | Tatsumura et al. ............. 326/41 |
| 2014/0368235 | A1 * | 12/2014 | Aoki et al. ...................... 326/38 |
| 2015/0009767 | A1 | 1/2015 | Kurokawa |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | A | 5/1999 |
| JP | 2000-044236 | A | 2/2000 |
| JP | 2000-150900 | A | 5/2000 |
| JP | 3106998 | B2 | 11/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2011-172214 | A | 9/2011 |

(56) References Cited

FOREIGN PATENT DOCUMENTS

| | | | |
|---|---|---|---|
| JP | 2012-186797 | A | 9/2012 |
| WO | 2004/114391 | A1 | 12/2004 |
| WO | 2011/089808 | A1 | 7/2011 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, Tet al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

(56) References Cited

OTHER PUBLICATIONS

Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.
Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.
Oba, F et al., "Defect energetics in ZnO: A hybrid Hartree-Fock density functional study," Phys. Rev. B (Physical Review. B), 2008, vol. 77, pp. 245202-1-245202-6.
Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.
Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.
Ihun Song et al.; "Short Channel Characteristics of Gallium—Indium—Zinc—Oxide Thin Film Transistors for Three Dimensional Stacking Memory"; IEEE Electron Device Letters; Jun. 1, 2008; pp. 549-552; vol. 29, No. 6.
Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.
Shoji Shukuri et al.; "A Semi-Static Complementary Gain Cell Technology for Sub-1 V Supply DRAM's"; IEEE Transactions on Electron Devices; Jun. 1, 1994; pp. 926-931, vol. 41, No. 6.
Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.
Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.
Ki Chul Chun et al.; "A 3T Gain Cell Embedded DRAM Utilizing Preferential Boosting for High Density and Low Power On-Die Caches"; IEEE Journal of Solid-State Circuits; 2011; pp. 1495-1505; vol. 46, No. 6.
T. Naito et al.; "World's first monolithic 3D-FPGA with TFT SRAM over 90nm 9 layer Cu CMOS"; 2010 Symposium on VLSI Technology : Digest of Technical Papers; Jun. 15, 2010; pp. 219-220.
Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.
Munehiro Kozuma et al.; "Crystalline In—Ga—Zn—O FET-based Configuration Memory for Multi-Context Field-Programmable Gate Array Realizing Fine-Grained Power Gating"; SSDM 2013 (Extended Abstracts of the 2010 International Conference on Solid State Devices and Materials), Sep. 24, 2013, pp. 1096-1097.
Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Orita, M et al., "Amorphous transparent conductive oxide InGaO3(ZnO)m (m<4):a Zn4s conductor," Philosophical Magazine, 2001, vol. 81, No. 5, pp. 501-515.
Orita, M et al., "Mechanism of Electrical Conductivity of Transparent InGaZnO4," Phys. Rev. B (Physical Review. B), Jan. 15, 2000, vol. 61, No. 3, pp. 1811-1816.
Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.
Osada, T et al., "Development of Driver-Integrated Panel Using Amorphous In—Ga—Zn—Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium—Gallium—Zinc Oxide TFTs and Their Application for Large Size AMOLED," AM-FPD '08 Digest of Technical Papers, Jul. 2, 2008, pp. 275-278.
Park, S et al., "Challenge to Future Displays: Transparent AM-OLED Driven by PEALD Grown ZnO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.
Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.
Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

# SEMICONDUCTOR DEVICE

BACKGROUND OF THE INVENTION

1. Field of the Invention

The present invention relates to an object, a method, or a manufacturing method. Further, the present invention relates to a process, a machine, manufacture, or a composition of matter. For example, in this specification, a semiconductor device, a method for driving the semiconductor device, and a method for manufacturing the semiconductor device are described. The present invention relates to a semiconductor device, for example, a circuit having a memory function of storing data, a processor including the circuit having the memory function, or an electronic device including the processor. Further, the present invention relates to a semiconductor device, for example, a display device or a light-emitting device.

Note that in this specification, a semiconductor device means a circuit including a semiconductor element (e.g., a transistor or a diode). The semiconductor device also means any device that can function by utilizing semiconductor characteristics. For example, an integrated circuit, a chip including an integrated circuit, a display device, a light-emitting device, and an electronic device are all semiconductor devices.

2. Description of the Related Art

A programmable logic device (PLD) is a kind of large integrated circuit (LSI), and is an integrated circuit whose internal circuit structure can be changed by a user with programming after shipment.

Fundamental components of the PLD are a plurality of logic elements performing logical operation and wirings connecting the logic elements to each other. The function of the PLD is changed by changing the function of each logic element and connection between the logic elements.

Data (configuration data) for setting the function of each logic element and the connection between the logic elements is stored in a memory device in the PLD. To write setting data to a memory device is referred to as configuration. A dynamic reconfiguration technology in which the circuit structure of a PLD is changed while a system including the PLD operates is known.

A multi-context method is known as a dynamic reconfiguration method. The multi-context method is a method for changing the circuit structure of a PLD by storing sets of configuration data corresponding to a plurality of circuit structures and switching the sets of configuration data to be used. A set of configuration data representing circuit structure data is referred to as a context.

With the downsizing of a PLD, an increase in power consumption due to an increase in leakage current becomes a problem. In order to solve the problem, for example, as disclosed in Patent Document 1, supply of power to unused or non-active circuit blocks is stopped by using a power gating switch. For example, as disclosed in Patent Document 2, supply of power to blocks that are independent of a circuit structure is stopped in accordance with the change in circuit structure by a programming cell including an oxide semiconductor.

Further, for example, as disclosed in Patent Document 3, the use of a memory including a transistor having an oxide semiconductor as a memory storing configuration data eliminates refresh operation.

REFERENCE

Patent Document 1: U.S. Pat. No. 7,098,689
Patent Document 2: Japanese Published Patent Application No. 2011-172214
Patent Document 3: Japanese Published Patent Application No. 2012-186797

SUMMARY OF THE INVENTION

It is an object of one embodiment of the present invention to provide a low-power semiconductor device. It is an object of one embodiment of the present invention to control whether to supply power in each logic element in a semiconductor device including logic elements, such as a PLD.

It is an object of one embodiment of the present invention to provide a highly reliable semiconductor device. It is an object of one embodiment of the present invention to provide a semiconductor device that is less influenced by a voltage drop. It is an object of one embodiment of the present invention to provide a semiconductor device having low leakage current (off-state current). It is an object of one embodiment of the present invention to provide a novel semiconductor device.

Note that other objects will be apparent from the description of the specification, the drawings, the claims, and the like, and other objects of embodiments of the present invention can be derived from the description of the specification, the drawings, the claims, and the like. One embodiment of the present invention does not necessarily achieve all the objects.

A semiconductor device according to one embodiment of the present invention includes at least a logic element, a terminal to which a potential is input from an external power source, a switch controlling conduction between the terminal and the logic element, and a memory outputting a control signal for setting the conduction state of the switch. The memory stores pieces of configuration data for setting the conduction state of the switch. The semiconductor device has a function of outputting any one of the pieces of configuration data as the control signal from the memory to the switch.

According to one embodiment of the present invention, it is possible to provide a semiconductor device that can control whether to supply power in each logic element.

DETAILED DESCRIPTION OF THE INVENTION

Figure 1:
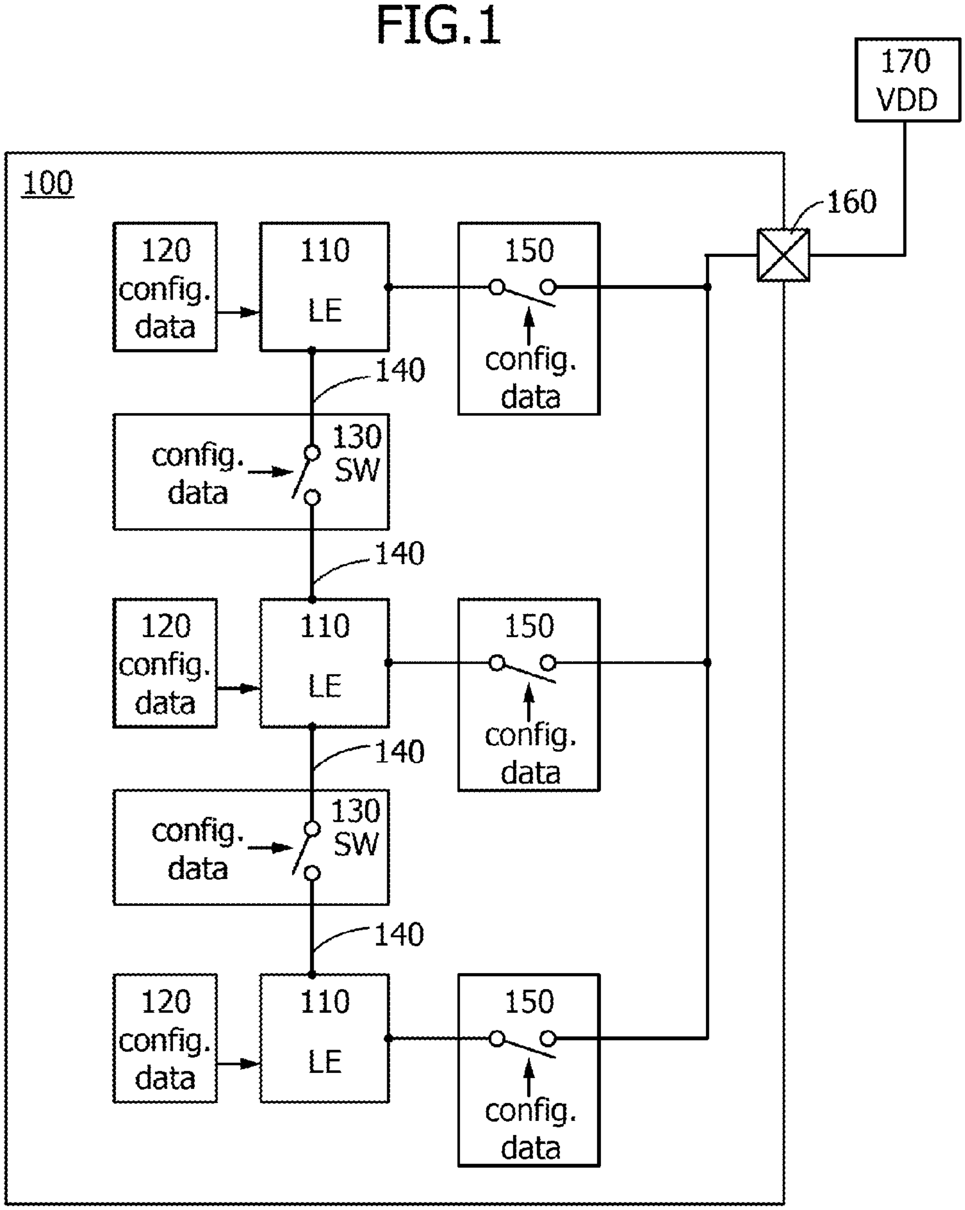
FIG. 1 is a block diagram illustrating a structure example of a programmable logic device.

Embodiments and an example of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments and the example.

In the drawings, the same portions or portions having a similar function are denoted by the same reference numerals, and the description thereof is not repeated.

Embodiment 1

In this embodiment, a programmable logic device (hereinafter referred to as PLD) is described as an example of a semiconductor device with reference to FIG. 1, FIG. 2, FIG. 3, FIG. 4, FIG. 5, FIG. 6, and FIGS. 7A to 7C.

Note that examples of user-programmable devices are small-scale integrated circuits such as a programmable array logic (PAL) and a generic array logic (GAL) and large-scale integrated circuits such as a complex programmable logic device (CPLD) and a field programmable gate array (FPGA). In this specification, programmable integrated circuits (including the above integrated circuits) are called PLDs.

<1-1. PLD>

A PLD in this embodiment includes a circuit (power gating circuit) having a function of switching the operating state (active or non-active) of a logic element with power gating.

The power gating circuit includes a terminal to which a power supply potential is input from the outside and a programmable switch controlling the conduction state between the logic element and the terminal. The conduction state of the switch is controlled by a signal output from a memory storing configuration data. The memory can store a plurality of contexts and stores pieces of configuration data for setting the conduction state of the switch.

Any one of the pieces of configuration data stored in the memory is output to a switch circuit as a control signal, and whether to supply a power supply potential to the logic element is determined. In other words, dynamic reconfiguration of connection between a power source and the logic element can be performed; thus, according to this embodiment, it is possible to provide a semiconductor device that can perform fine-grained power supply even when a system including the PLD operates.

FIG. 1 is a block diagram illustrating a structure example of a PLD in this embodiment. A PLD 100 in FIG. 1 includes a plurality of logic elements 110, a plurality of memories 120, a plurality of switch circuits 130, and a plurality of power gating circuits 150.

The logic element (LE) 110 is a circuit having a logical operation function, and reconfiguration of the logic element 110 can be performed using configuration data stored in the memory 120. The logic element 110 is a fundamental unit performing fundamental logical operation for operating the PLD 100 and is also referred to as a processing element (PE).

The memory 120 has a function of storing configuration data of the logic element 110. Note that a memory storing configuration data like the memory 120 is referred to as a configuration memory in some cases. The memory 120 stores data of a look-up table in the logic element 110, data for setting connection between internal circuits of the logic element 110, and the like. The memory 120 can store a plurality of contexts. Depending on configuration data read from the memory 120, processing executed by the logic element 110 is changed.

Note that in FIG. 1, the memory 120 corresponding to each logic element 110 is provided; however, one memory 120 can output configuration data to the plurality of logic elements 110.

The switch circuit (SW) 130 is a programmable switch controlling conduction between the logic elements 110 and is provided between wirings 140 connecting the logic elements 110 to each other. The switch circuit 130 has a memory function of storing configuration data for setting the conduction state of the switch. The memory of the switch circuit 130 can store a plurality of contexts and stores pieces of configuration data for setting the conduction state of the switch. By switching configuration data output from the memory, connection between the logic elements 110 can be changed.

Note that in order to avoid confusion in FIG. 1, the structure of the PLD 100 is simplified and two logic elements (upper and lower logic elements) 110 can be connected to each other; however, the connection is not limited to such connection. As for the connection between the logic elements 110, given two logic elements 110 can be connected to each other by changing the design of the switch circuit 130 and the wiring 140. Further, although two logic elements 110 are connected to each other through one wiring 140, the two logic elements 110 can be connected to each other through a wiring group of the plurality of wirings 140.

A power supply potential VDD is supplied from an external power source 170 to the PLD 100. The power supply potential VDD is input to a terminal 160. Whether to supply the power supply potential VDD to each logic element 110 is controlled by the power gating circuit 150.

Here, whether to supply the power supply potential VDD is controlled by the power gating circuit 150; however, this embodiment is not limited thereto. For example, in one aspect of an embodiment of the present invention, whether to supply a power supply potential VSS that is lower than VDD can be controlled. Alternatively, for example, in one aspect of an embodiment of the present invention, whether to supply a power supply potential (ground potential) GND can be controlled.

The power gating circuit 150 functions as a programmable switch. Depending on the conduction state of the switch, the logic element 110 can be made active or non-active. Further, the power gating circuit 150 has a memory storing configuration data for setting whether to supply VDD to the logic element 110. Like the memory 120, the memory of the power gating circuit 150 can store a plurality of contexts and stores pieces of configuration data for setting the conduction state of the switch. By changing a context output from the memory, conduction and non-conduction between the logic element 110 and the terminal 160 can be switched.

In this manner, whether to supply power in each logic element 110 can be selected by only switching output data from the memory of the power gating circuit 150, that is, by only a context switch; thus, fine-grained power control can be achieved. Even while a system (semiconductor device) including the PLD 100 executes processing, supply of power to the logic element 110 can be controlled. Thus, power can be supplied only to the logic element 110 necessary for the processing of the PLD 100, so that the total power consumption of the PLD 100 can be reduced. Further, when configuration data of the power gating circuit 150 is determined, a condition that the physical positions of the logic element 110 to be operated and the logic element 110 to be stopped are uniform can be employed. By determining the configuration data in this manner, a local voltage drop in the PLD 100 can be reduced, so that the operational reliability of the PLD 100 is increased.

<1.2. Power Gating Circuit>

Figure 2:
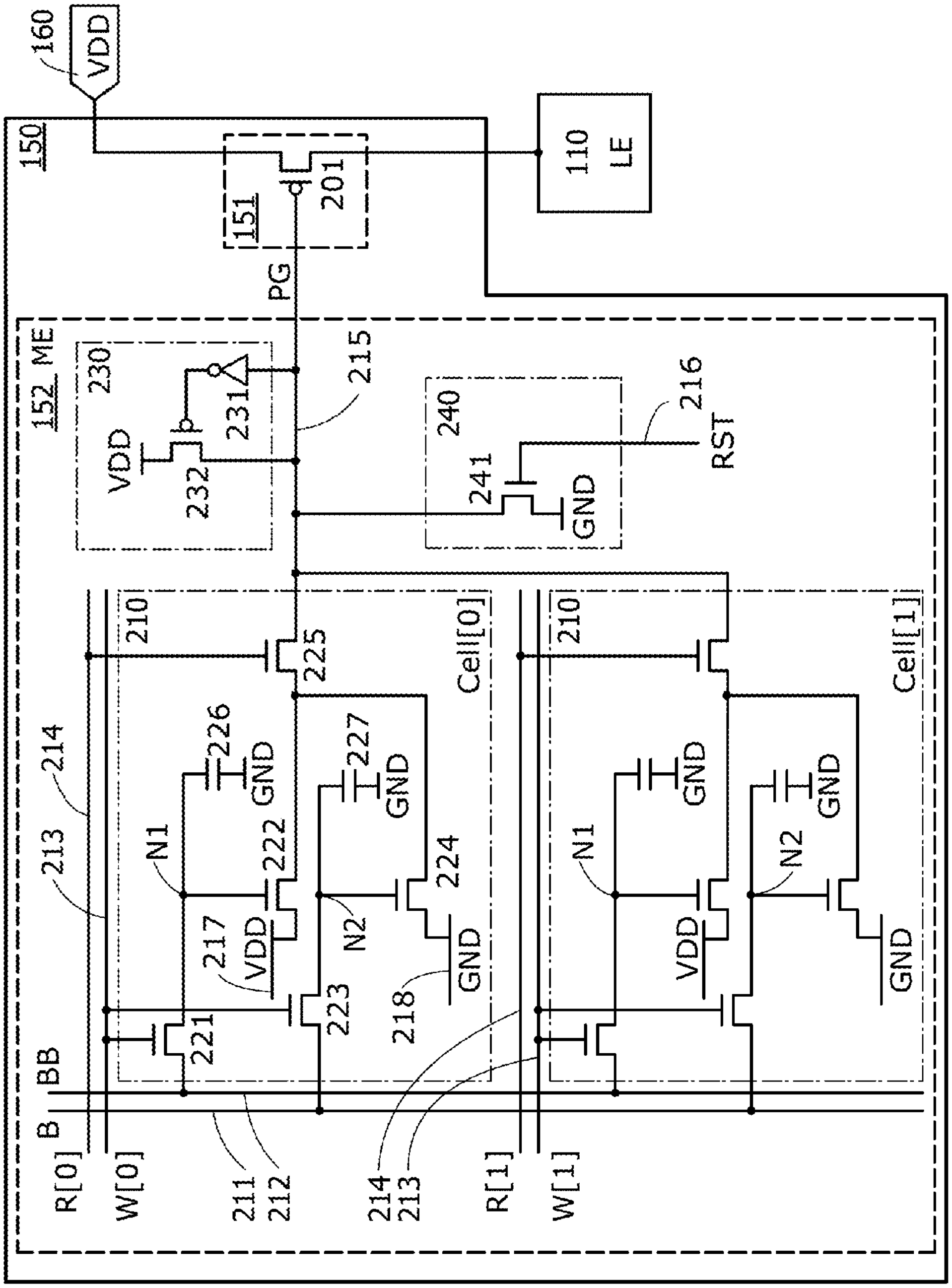
FIG. 2 is a circuit diagram illustrating a structure example of a power gating circuit.

A specific circuit structure of the power gating circuit 150 is described below with reference to FIG. 2. A memory element 152 preferably includes a nonvolatile data retention portion that retains data even after power supply is stopped. FIG. 2 illustrates a power gating circuit including a nonvolatile data retention portion as a structure example of the power gating circuit 150.

The power gating circuit 150 includes a switch circuit 151 and the memory element (ME) 152. The switch circuit 151 has a function of switching conduction and non-conduction between the logic element 110 and the terminal 160. The memory element 152 is a memory circuit having a function of storing configuration data for setting whether to supply power to the logic element 110. The memory element 152 stores at least data for setting the on/off state of the switch circuit 151 as configuration data. Configuration data output from the memory element 152 determines the on/off state of the switch circuit 151.

The memory element 152 is a nonvolatile memory that retains data even after power supply is stopped. It is not necessary to load data from outside the PLD 100 because the memory element 152 is a nonvolatile memory. Accordingly, the startup operation of the PLD 100 and power consumption required to start up the PLD 100 can be reduced. Note that while the memory element 152 retains data as a nonvolatile memory, at least one power supply voltage may be supplied. In other words, the memory element 152 may retain data in the substantially same manner as a nonvolatile memory.

<1.2.1. Switch Circuit>

The switch circuit 151 includes a transistor 201. A signal PG is input from the memory element 152 to a gate of the transistor 201 to control the on/off state of the transistor 201. Depending on the on/off state of the transistor 201, whether to supply power to the logic element 110 is determined. Although the transistor 201 is a p-channel transistor in FIG. 2, the transistor 201 can be an n-channel transistor.

<1.2.2. Memory Element>

The memory element 152 is a memory that can store a plurality of contexts. Thus, the memory element 152 includes memory cells 210, and the number of memory cells 210 is the same as the number of contexts. Here, the number of contexts is 2. As illustrated in FIG. 2, two memory cells 210 are arranged in an array (two rows by one column), wirings 211 and 212 are provided in a column direction, and two wirings 213 and two wirings 214 are provided in a row direction. The memory element 152 further includes a wiring 215 for data output, and a latch circuit 230 and a reset circuit 240 that are connected to the wiring 215.

Note that in FIG. 2, a number such as [0] is used to distinguish signals, circuits, and the like having the same function and used similarly in other drawings. In addition, the power supply potential VDD is referred to as a potential VDD or VDD in some cases. The same applies to other potentials, signals, elements, wirings, and the like.

The wiring 211 and the wiring 212 are data lines (bit lines) to which signals B and BB (data signals) corresponding to configuration data are input. The inversion signal BB of the signal B is input to the wiring 212. The wiring 213 is a selection signal line (word line) supplied with a signal W (selection signal) for selecting the memory cell 210 to which configuration data is written. The wiring 214 is a selection signal line supplied with a signal R (selection signal) for selecting the memory cell 210 from which configuration data is read. Configuration data is output to the wiring 215 as the signal PG. The signal PG controls the conduction state of the switch circuit 151.

Note that by inputting the signal B to an inverter circuit to generate the inversion signal BB, one of the wiring 211 and the wiring 212 can be omitted.

The value of configuration data stored in the memory element 152 is determined by the potentials (signals B and BB) of the wiring 211 and the wiring 212. A data value "0" is written to the memory cell 210 when the signal B is a high level (data value "1"), and the data value "1" is written to the memory cell 210 when the signal B is a low level (data value "0").

Through output operation of the memory element 152, one of pieces of configuration data is selected and output to the switch circuit 151 through the wiring 215 as the signal PG. When the signal PG is the data value "0", the transistor 201 is turned on and power is supplied to the logic element 110, so that the logic element 110 becomes active. When the signal PG is the data value "1", the transistor 201 is turned off and power supply to the logic element 110 is stopped, so that the logic element 110 becomes non-active.

<1.2.2.a. Memory Cell>

In the example of FIG. 2, the memory cell 210 is a memory storing 1-bit data. The memory cell 210 includes a first unit (a transistor 221, a transistor 222, and a capacitor 226) for storing the data value "1" (high-level data) and a second unit (a transistor 223, a transistor 224, and a capacitor 227) for storing the data value "0" (low-level data). Nodes N1 and N2 are potential hold portions of the units and function as nonvolatile data retention portions of the memory cell 210. A transistor 225 functions as a switch connecting the memory cell 210 to the wiring 215.

First, connection of the first unit is described. A gate of the transistor 221 is connected to the wiring 213, a source of the transistor 221 is connected to the wiring 212, and a drain of the transistor 221 is connected to a gate (node N1) of the transistor 222. One terminal of the capacitor 226 is connected to the gate (node N1) of the transistor 222. The gate of the transistor 222 is connected to the node N1, a source of the transistor 222 is connected to a wiring 217, and a drain of the transistor 222 is connected to a source of the transistor 225.

The structure of the second unit is similar to that of the first unit. A gate of the transistor 223 is connected to the wiring 213, a source of the transistor 223 is connected to the wiring 211, and a drain of the transistor 223 is connected to a gate (node N2) of the transistor 224. One terminal of the capacitor 227 is connected to the gate (node N2) of the transistor 224. The gate of the transistor 224 is connected to the node N2, a source of the transistor 224 is connected to a wiring 218, and a drain of the transistor 224 is connected to a source of the transistor 225.

A gate of the transistor 225 is connected to the wiring 214, the source of the transistor 225 is connected to the drains of the transistors 222 and 224, and a drain of the transistor 225 is connected to the wiring 215. The transistor 225 functions as a switch connecting the first and second units to the wiring 215.

Note that a transistor is an element having three terminals: a gate, a source, and a drain. The functions of two terminals (the source and the drain (excluding the gate)) might interchange depending on the conductivity type (n p-type or p-type) of the transistor and potentials input to the terminals. Thus, in the memory cell 210, the relation of the source and the drain might be opposite. The same applies to other circuits.

The transistor 221 functions as a switch controlling conduction between the wiring 212 and the node N1, and the transistor 223 functions as a switch controlling conduction between the wiring 211 and the node N2. The on/off states of the transistor 221 and the transistor 223 are controlled by the signal W input to the wiring 213.

When the transistor 221 and the transistor 223 are off, the capacitor 226 and the capacitor 227 have functions of making the nodes N1 and N2 electrically floating to hold the potentials of the nodes N1 and N2.

The transistor 222 and the transistor 225 are connected in series between the wiring 217 and the wiring 215 and function as switches connecting the wiring 217 to the wiring 215. The transistor 224 and the transistor 225 are connected in series between the wiring 218 and the wiring 215 and function as switches connecting the wiring 218 to the wiring 215.

The on/off states of the transistor 222, the transistor 224, and the transistor 225 are controlled by the potential of the node N1, the potential of the node N2, and the potential (signal R) of the wiring 214, respectively.

The wiring 217 functions as a potential supply line supplying a high potential, and the wiring 218 functions as a potential supply line supplying a low potential. Here, VDD that is equal to a power supply potential of the PLD 100 is supplied through the wiring 217, and the ground potential (GND) is supplied through the wiring 218. The potential supplied through the wiring 217 is not limited to VDD but may be a potential with which a high-level potential (potential for turning off the switch circuit 151) can be applied to the wiring 215. In addition, the potential of the wiring 218 is not limited to GND but may be a potential with which a low-level potential (potential for turning on the switch circuit 151) can be applied to the wiring 215.

In order to hold the potentials of the floating nodes N1 and N2, it is preferable to use transistors having low leakage current in an off state (off-state current) as the transistor 221 and the transistor 223. Here, low off-state current means that normalized off-state current per micrometer of a channel width at room temperature is lower than or equal to 10 zA. Since the off-state current is preferably as low as possible, the normalized off-state current is preferably lower than or equal to 1 zA, more preferably lower than or equal to 10 yA, still more preferably lower than or equal to 1 yA. Note that voltage between a source and a drain in that case is, for example, approximately 0.1 V, 5 V, or 10 V. An example of a transistor having such low off-state current is a transistor including an oxide semiconductor in a channel.

In this embodiment, in the memory cell storing configuration data, a wiring through which data is input is connected to a potential hold portion through a switch, and data is written or retained by turning on or off the switch. Thus, in a data retention period, it is preferable to use a transistor having low off-state current as a switch suitable for inhibiting variations in potential of the potential hold portion.

When the transistor 221 and the transistor 223 have low off-state current, the memory element 152 can be a nonvolatile memory that retains data after power supply is stopped. Accordingly, even after the operation of the PLD 100 is stopped, the power gating circuit 150 retains configuration data on connection between the logic element 110 and the power source 170. Consequently, it is not necessary to load configuration data into the power gating circuit 150 when the PLD 100 is started up, so that power consumption at the time of start-up and startup time can be reduced, for example.

By reducing the off-state current of the transistor 221 and the transistor 223 and setting the capacitance of the capacitor 226 and the capacitor 227 as appropriate, the memory cell 210 can be a memory (nonvolatile memory) that retains data even after power supply is stopped. For example, in the case where the off-state current of the transistor 221 and the transistor 223 is $5\times10^{-23}$ A and the allowable change in potential of the nodes N1 and N2 is 0.1 V, a data retention period can be approximately 10 years when the capacitance of the capacitor 226 and the capacitor 227 is approximately 158 fF.

A method for writing the data value "1" to the memory cell 210 is described. After the wiring 211 is set to a low level and the wiring 212 is set to a high level, the wiring 213 is set to a high level to turn on the transistor 221 and the transistor 223. The node N1 is set to a high level and the node N2 is set to a low level. After that, the wiring 213 is set to a low level to make the node N1 and the node N2 electrically floating. In other words, the potential of the node N1 is a potential with which the transistor 222 is turned on, and the potential of the node N2 is a potential with which the transistor 224 is turned off.

In the case where the data value "0" is written to the memory cell 210, first, the wiring 211 is set to a high level and the wiring 212 is set to a low level. After that, the wiring 213 is set to a high level so that the node N1 is set to a low level and the node N2 is set to a high level. After that, the wiring 213 is set to a low level to make the node N1 and the node N2 electrically floating.

Data is output by switching the transistor 225. By turning on the transistor 225 by the signal R input to the wiring 214, configuration data stored in the memory cell 210 is output to the switch circuit 151 through the wiring 215 as the signal PG. For example, since the node N2 is at a low level when the node N1 is at a high level, a high-level potential is applied to the wiring 215.

<1.2.2.b. Latch Circuit>

A latch circuit 230 has a function of preventing a voltage drop of the wiring 215 that corresponds to the threshold voltage of the transistor 222 when a high-level data (data value "1") is output from the memory cell 210 to the wiring 215. Thus, the latch circuit 230 is referred to as a weak keeper circuit in some cases. The latch circuit 230 includes an inverter 231 and a p-channel transistor 232.

<1.2.2.c. Reset Circuit>

A reset circuit 240 resets the signal PG (potential of the wiring 215) to an initial value (data value "0") and includes a transistor 241 and a wiring 216 to which a signal RST is input. The signal RST is a reset signal. By turning on the transistor 241 by the signal RST, the potential of the wiring 215 can be a low potential (here, GND). In the structure of FIG. 2, by resetting the signal PG to the initial value, the transistor 201 is turned on, so that power is supplied to the logic element 110.

In FIG. 2, the memory element 152 is a memory capable of storing data whose context number is 2; however, the number of memory cells 210 can be increased in accordance with the number of needed contexts. When the number of contexts is more than or equal to 3, contexts can be switched in a given order. Thus, whether to supply power to the logic element 110 can be more flexibly determined in accordance with the function of the PLD 100.

<1.2.3. Operation of Power Gating Circuit>

Dynamic reconfiguration of the PLD 100 performed by the power gating circuit 150 is described below with reference to FIG. 3.

Figure 3:
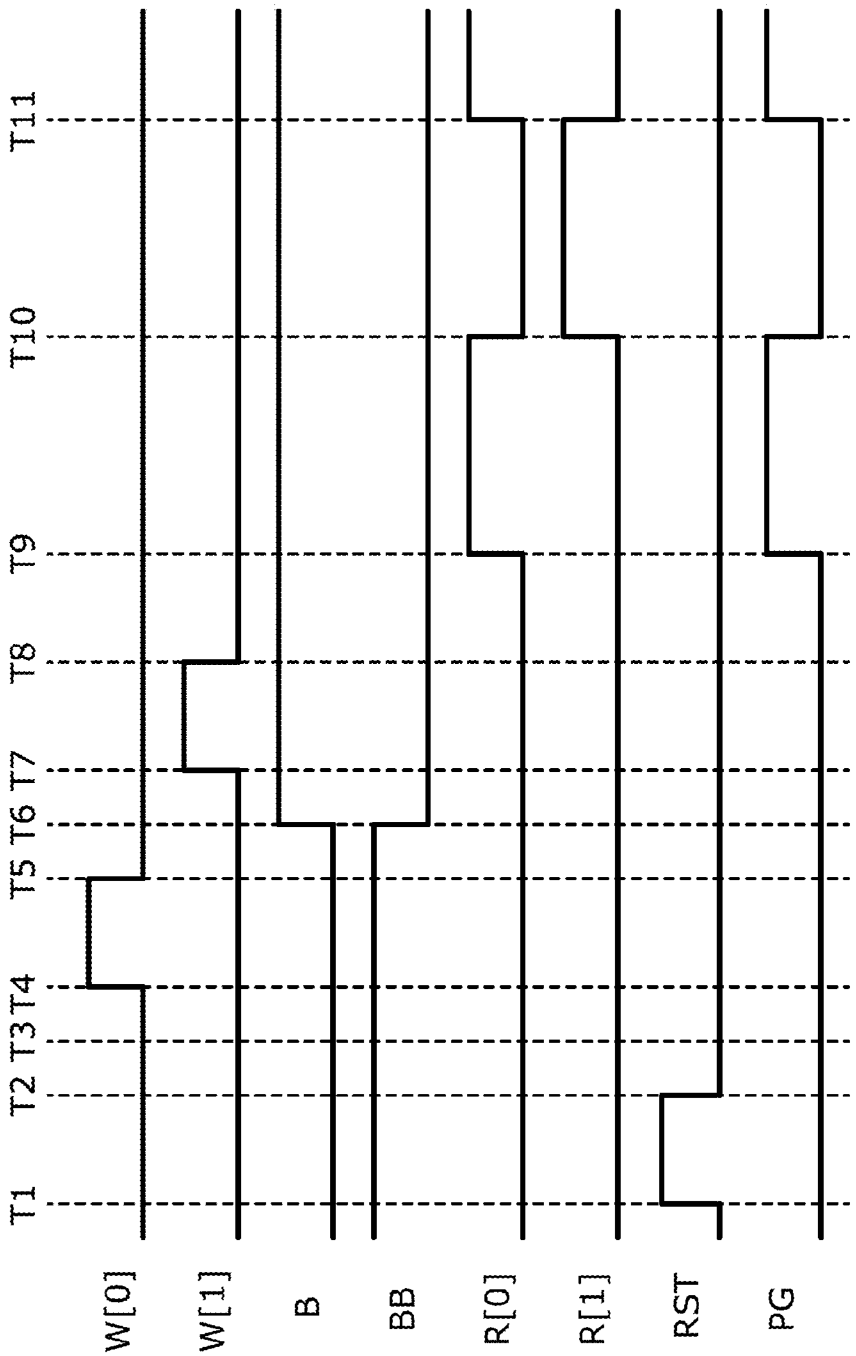
FIG. 3 is a timing chart illustrating an operation example of the power gating circuit.

FIG. 3 is a timing chart illustrating an example of a method for operating the power gating circuit 150. FIG. 3 shows waveforms of signals input to the wirings 211 to 216 in FIG. 2. In the description of FIG. 3, in the power gating circuit 150, the memory cell 210 in a first row and a first column is referred to as Cell[0] and the memory cell 210 in a second row and the first column is referred to as Cell[1]. Configuration data corresponding to a first context is stored in Cell[0], and configuration data corresponding to a second context is stored in Cell[1].

FIG. 3 is a timing chart showing reset operation, operation of writing two pieces of configuration data corresponding to two contexts to the power gating circuit 150, operation of outputting the configuration data corresponding to the first context, and operation of outputting the configuration data corresponding to the second context.

In periods T1 and T2, the reset operation is performed. The high-level signal RST is output to the wiring 216 to turn on the transistor 241. By this operation, the signal PG is set to a low level to turn on the transistor 201; thus, power is supplied to the logic element 110.

In periods T3 to T5, operation of writing configuration data to Cell[0] is performed. Here, configuration data for stopping supply of power to the logic element 110 is written to Cell[0]. In time T3, the low-level signal B is input to the wiring 211, and the inversion signal BB of the signal B is input to the wiring 212. In time T4, a signal W[0] is set to a high level to turn on the transistor 221 and the transistor 223. In time T5, the signal W[0] is set to a low level to turn off the transistor 221 and the transistor 223. As described above, configuration data "0" is written to and retained in Cell[0].

In periods T6 to T8, operation of writing configuration data to Cell[1] is performed. Here, configuration data for supplying power to the logic element 110 is written to Cell[1]. In time T6, the high-level signal B is input to the wiring 211, and the inversion signal BB is input to the wiring 212. In time T7, the signal W[0] is set to a high level. In time T8, the signal W[0] is set to a low level. As described above, configuration data "1" is written to and retained in Cell[1].

In periods T9 and T10, operation of outputting configuration data from Cell[0] is performed. When a high-level signal R[0] is input to the wiring 214, the high-level signal PG is output from Cell[0] to the wiring 215. The signal PG turns off the transistor 201, so that supply of power to the logic element 110 is stopped.

In periods T10 and T11, operation of outputting configuration data from Cell[1] is performed. When a high-level signal R[1] is input to the wiring 214, the low-level signal PG is output from Cell[1] to the wiring 215. The signal PG turns on the transistor 201, so that supply of power to the logic element 110 is restarted.

Setting the signal R[0] to a high level corresponds to operation of switching configuration data to the first context, and setting the signal R[1] to a high level corresponds to operation of switching configuration data to the second context. In other words, by switching the two contexts while the PLD 100 operates, dynamic reconfiguration of supply of power to the logic element 110 can be performed. Thus, the PLD 100 can be a low-power high-speed processor.

If a constraint where the physical positions of the logic element 110 to be operated and the logic element 110 to be stopped are uniform is employed when configuration data is generated, a local voltage drop in the PLD 100 can be reduced, so that the operational reliability of the PLD 100 can be increased.

Note that in the structure of FIG. 2, initialization by the signal RST turns on the transistor 201 and supplies power to all the logic elements 110; however, initialization can turn off the switch circuit 151 and can supply power to none of the logic elements 110. A structure where initialization supplies power to all the logic elements 110 is preferable in the case where the number of logic elements 110 is large when the PLD 100 starts to operate. In contrast, in the case where the number of logic elements 110 is small when the PLD 100 starts to operate, a structure where initialization supplies power to none of the logic elements 110 is effective in reducing power consumption.

The logic element 110 that does not need to be stopped while the PLD 100 operates can be always supplied with power from the terminal 160 without the power gating circuit 150. In the PLD 100 with such a structure, partial dynamic reconfiguration of connection between the logic element 110 and the terminal 160 is performed. Further, one power gating circuit 150 may be provided for the plurality of logic elements 110.

<1.3. Memory>

The memory 120 is described below with reference to FIG. 4 and FIG. 5.

Figure 4:
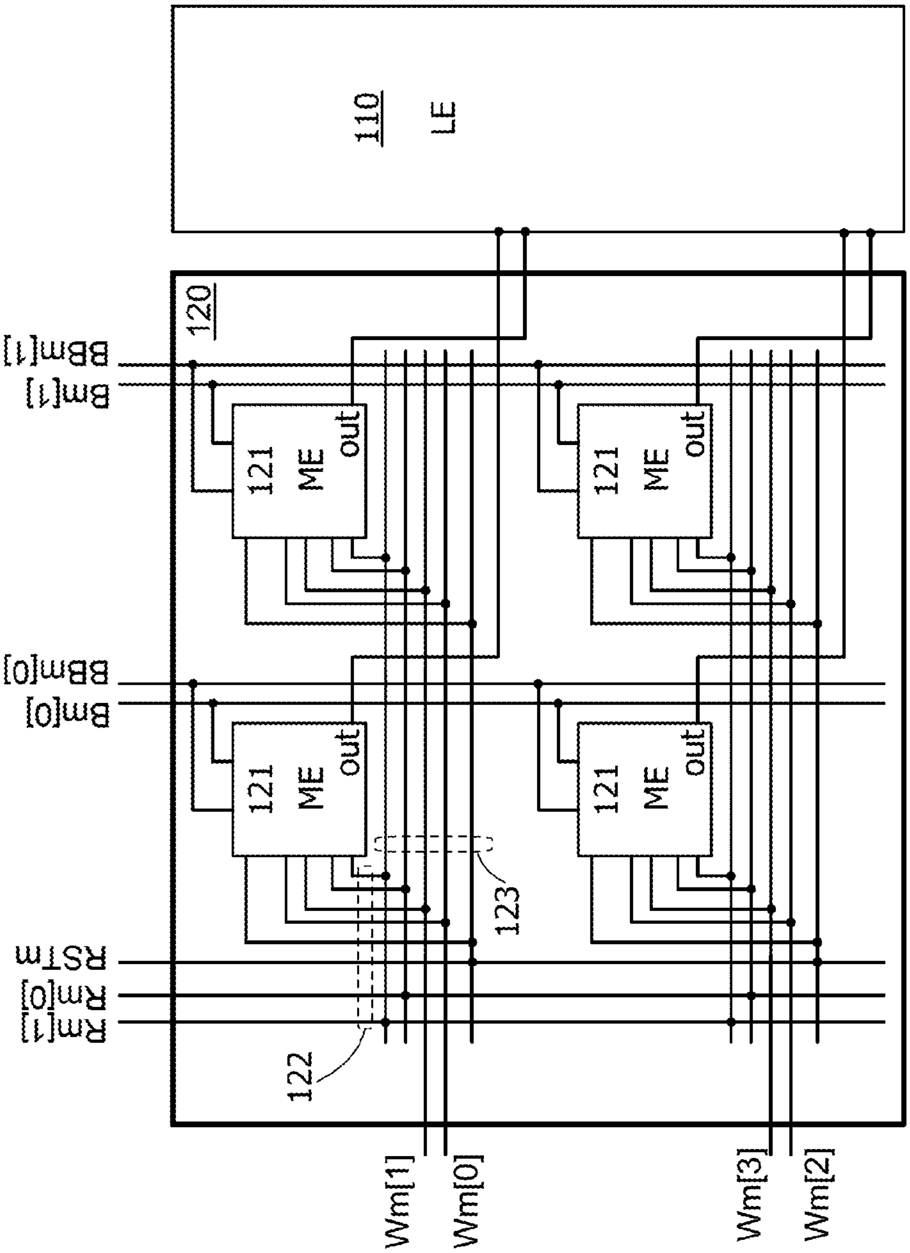
FIG. 4 is a block diagram illustrating a structure example of a memory.

FIG. 4 is a block diagram illustrating a structure example of the memory 120.

The memory 120 can store configuration data corresponding to a plurality of contexts. Thus, the memory 120 includes a plurality of memory elements (MEs) 121, and each memory element (ME) 121 can store configuration data corresponding to a plurality of contexts.

The plurality of memory elements 121 are arranged in an array, and a wiring group 122 and a wiring group 123 including a plurality of wirings arranged in a horizontal direction and a vertical direction are provided for the memory elements 121. The wiring group 122 is a set of wirings in the vertical direction, and the wiring group 123 is a set of wirings in the horizontal direction. The wiring groups 122 and 123 include an input wiring and an output wiring for the memory element 121. Outputs of the memory elements 121 are connected to different input terminals of the logic elements 110.

The memory element 121 can store data corresponding to two or more contexts, and can have a structure similar to that of the memory element 152 of the power gating circuit 150, for example. FIG. 5 illustrates a structure example of the memory element 121. FIG. 5 also illustrates the memory element 121 in a first row and a first column. The memory element 121 can have a structure similar to that of the memory element 152 of the power gating circuit 150 (FIG. 2).

Figure 5:
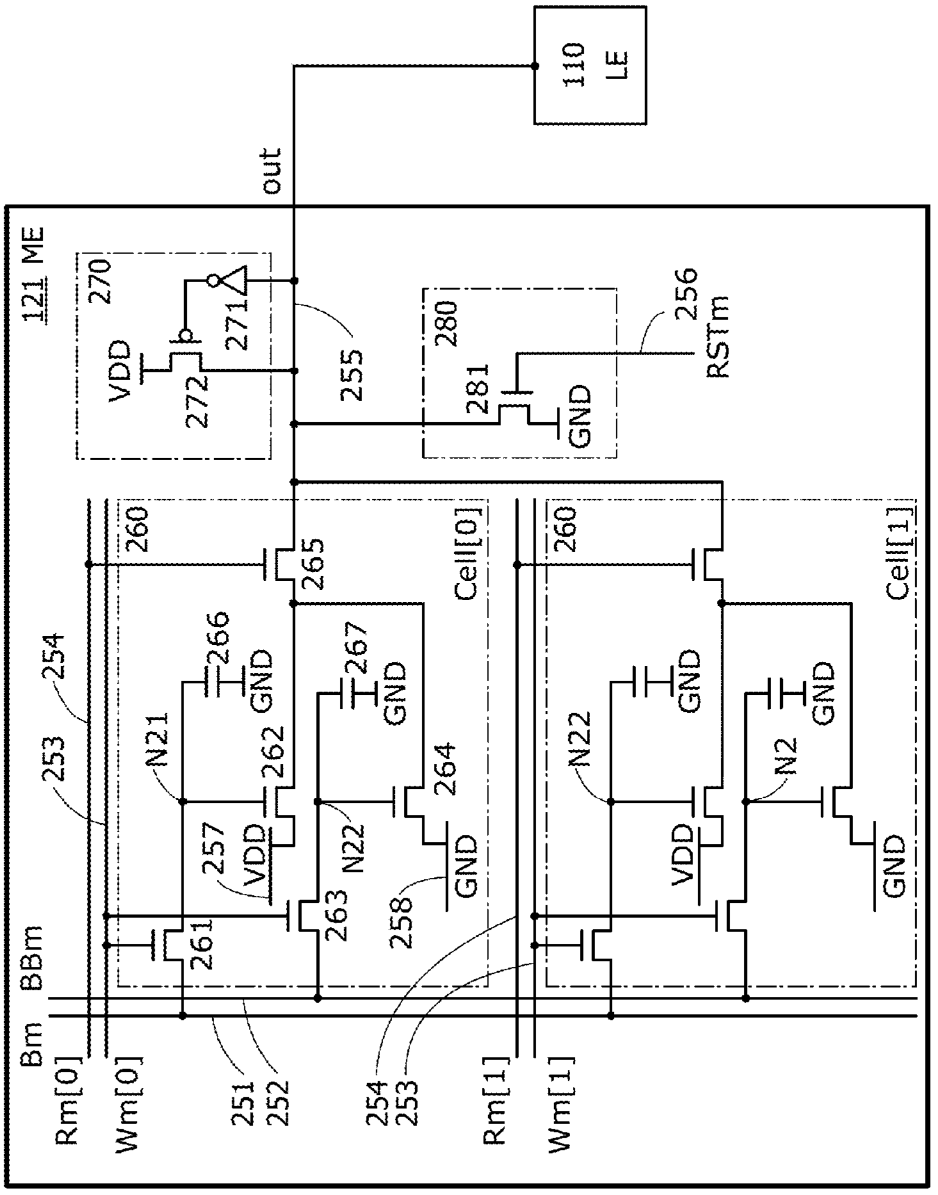
FIG. 5 is a circuit diagram illustrating a structure example of a memory cell of the memory.

As illustrated in FIG. 5, the memory element 121 includes memory cells 260 (Cell[0] and Cell[1]), wirings 251 to 258, and a latch circuit 270 and a reset circuit 280 that are connected to the wiring 255.

The latch circuit 270 includes an inverter 271 and a transistor 272. Like the latch circuit 230 (FIG. 2), the latch circuit 270 has a function of preventing a voltage drop of the wiring 255 when a high-level potential is applied from the memory cell 260 to the wiring 255.

Like the reset circuit 240 (FIG. 2), the reset circuit 280 resets the potential of the wiring 255 to an initial value (data value "0") and includes a transistor 281 and the wiring 256 to which a reset signal RS™ is input. While data is written to (configuration is performed on) the memory element 121, the signal RS™ can fix the potential of the wiring 255 to GND.

Signals Bm and BBm are data signals corresponding to configuration data, and the signal BBm is an inversion signal of the signal Bm. A signal Wm is a write selection signal, and a signal Rm is a read selection signal.

The memory cell 260 includes nodes N21 and N22, transistors 261 to 265, and capacitors 266 and 267. The memory cell 260 differs from the memory cell 210 of the power gating circuit 150 in that the transistor 261 is connected to the wiring 251 and that the transistor 263 is connected to the wiring 252. Thus, a data value "1" is written to the memory cell 260 when the signal Bm is a high level (data value "1"), and a data value "0" is written to the memory cell 260 when the signal Bm is a low level (data value "0"). Since the operation of the memory element 121 is similar to that of the memory element 152, the description of the memory element 152 is referred to.

In the example of FIG. 5, the number of contexts in the memory element 121 is 2; however, the number of contexts can be 3 or more. The number of memory cells 260 may be increased in accordance with the number of needed contexts.

<1.4.1. Structure Example of Switch Circuit>

Figure 6:
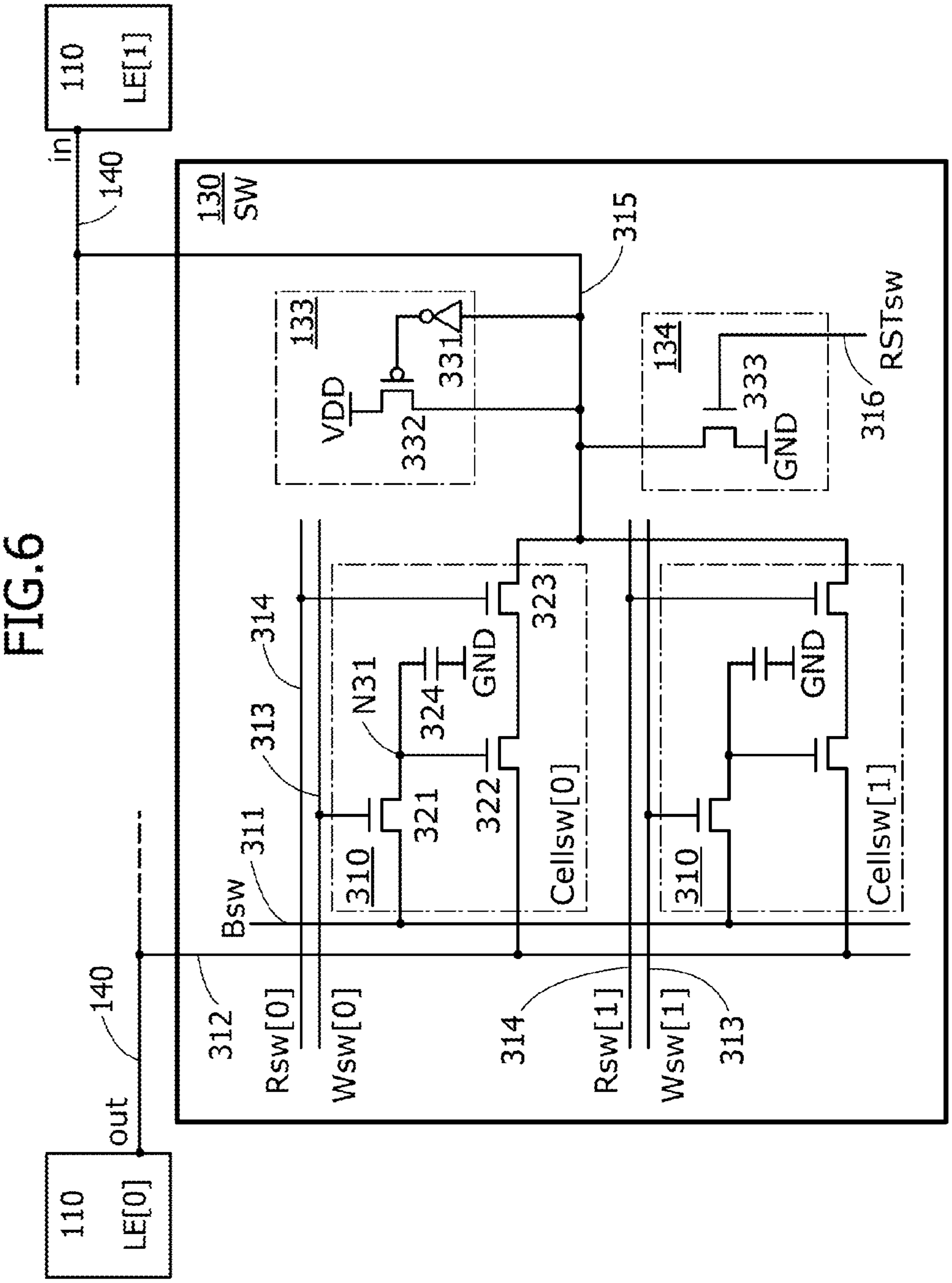
FIG. 6 is a circuit diagram illustrating a structure example of a switch circuit connecting logic elements to each other.

The structure of the switch circuit 130 is described below with reference to FIG. 6. FIG. 6 is a circuit diagram illustrating a structure example of the switch circuit 130. The switch circuit 130 functions as a programmable switch connecting an output of the logic element 110 (LE[0]) to an input of the logic element 110 (LE[1]).

Like the memory element 152 (FIG. 2), the switch circuit 130 stores two contexts and includes two memory cells 310 (Cellsw[0] and Cellsw[1]) arranged in an array (two rows by one column) The switch circuit 130 further includes a wiring 311 and a wiring 312 in a column direction, two wirings 313 and two wirings 314 in a row direction, a wiring 315 having a function of outputting data, and a latch circuit 133 and a reset circuit 134 that are connected to the wiring 315.

The latch circuit 133 functions as a weak latch for preventing a potential drop of the wiring 315, and includes an inverter 331 and a p-channel transistor 332 like the latch circuit 230 of the power gating circuit 150 (FIG. 2).

Like the reset circuit 240 of the power gating circuit 150 (FIG. 2), the reset circuit 134 resets the potential of the wiring 315 to an initial value (data value "0") and includes a transistor 333 and a wiring 316 to which a signal RSTsw is input. The signal RSTsw is a reset signal. By turning on the transistor 333 by the signal RSTsw, the potential of the wiring 315 can be a low potential (here, GND). Thus, while data is written to (configuration is performed on) the switch circuit 130, the signal RSTsw can fix the potential of the wiring 315 to GND.

The memory cell 310 is connected to the wirings 311 to 315. The wiring 311 is a data line (bit line) to which a signal Bsw corresponding to configuration data is input. The wiring 312 is connected to the logic element 110 (wiring 140). The wiring 313 is a selection signal line supplied with a signal Wsw (selection signal) for selecting the memory cell 310 to which configuration data is written. The wiring 314 is a selection signal line supplied with a signal Rsw (selection signal) for selecting the memory cell 310 from which configuration data is read. Configuration data read from the memory cell 310 is output to the wiring 315. The wiring 315 is connected to the logic element 110 (wiring 140).

The value of configuration data stored in the memory cell 310 is determined by the potential (signal Bsw) of the wiring 311. A data value "1" is written to the memory cell 310 when the signal Bsw is a high level (data value "1"), and a data value "0" is written to the memory cell 310 when the signal Bsw is a low level (data value "0").

Operation of outputting configuration data from the memory cell 310 can change connection between two logic elements 110. In the case where a transistor 323 in the memory cell 310 having the data value "1" is turned on, the wiring 312 is connected to the wiring 315 and two logic elements 110 are connected to each other. In contrast, in the case where the data value is "0", the wiring 312 is not connected to the wiring 315.

The memory cell 310 is a circuit capable of storing 1-bit data and includes three transistors 321 to 323, a capacitor 324, and a node N31. The node N31 functions as a potential hold portion. A gate of the transistor 321 is connected to the wiring 313, a source of the transistor 321 is connected to the wiring 312, and a drain of the transistor 321 is connected to a gate (node N31) of the transistor 322. One terminal of the capacitor 324 is connected to the gate (node N31) of the transistor 322. The gate of the transistor 322 is connected to the node N31, a source of the transistor 322 is connected to the wiring 312, and a drain of the transistor 322 is connected to a source of the transistor 323. A gate of the transistor 323 is connected to the wiring 314, and a drain of the transistor 323 is connected to the wiring 315.

The transistor 321 functions as a switch controlling connection between the wiring 311 and the node N31, and the on/off state of the transistor 321 is controlled by the signal Wsw input to the wiring 313. The capacitor 324 has a function of making the node N31 electrically floating when the transistor 321 is off and holding the potential of the node N31.

The transistor 322 and the transistor 323 are connected in series between the wiring 312 and the wiring 315 and function as switches connecting the wiring 312 to the wiring 315. The on/off states of the transistor 322 and the transistor 323 are controlled by the potential of the node N31 and the potential of the wiring 314 (signal Rsw), respectively.

As described above, in a memory cell, it is preferable to use a transistor having low off-state current as a switch connecting a wiring through which data is input to a potential hold portion. In the memory cell 310, the transistor 321 functions as such a switch. Thus, like the transistors 221 and 223 (see FIG. 2), the transistor 321 preferably has low off-state current, which is lower than or equal to $1\times10^{-14}$ A. An example of a transistor having such low off-state current is a transistor including an oxide semiconductor in a channel.

By reducing the off-state current of the transistor 321 and setting the capacitance of the capacitor 324 as appropriate, the memory cell 310 can be a nonvolatile memory that retains data after power supply is stopped. For example, in the case where the off-state current of the transistor 321 is $5\times10^{-23}$ A and the allowable change in potential of the node N31 is 0.1 V, a data retention period can be approximately 10 years when the capacitance of the capacitor 324 is approximately 158 fF.

In the case where the memory in the switch circuit 130 is a nonvolatile memory, it is not necessary to load configuration data into the switch circuit 130 when the PLD 100 is started up. Thus, power consumption at the time of start-up and startup time can be reduced.

In the switch circuit 130, the node N31 is made electrically floating by turning off the transistor 321 other than time when configuration data is written. Accordingly, the switch circuit 130 can be operated by utilizing the boosting effect on the potential of the node N31 (the gate of the transistor 322).

When the node N31 is floating, the potential of the node N31 is increased by source-gate capacitance Cgs of the transistor 322 as the potential of the wiring 312 is changed from a low level to a high level. The increase in potential of the node N31 depends on the data value of configuration data written to the memory cell 310.

When the data value is "0", the transistor 322 is in a weak inversion mode, so that the capacitance Cgs that contributes to the increase in potential of the node N31 includes capacitance Cos that is independent of the potential of the gate (node N31) of the transistor 322. Specifically, the capacitance Cos includes overlap capacitance generated in a region where the gate electrode and a source electrode overlap with each other, and parasitic capacitance generated between the gate electrode and the source electrode, for example. When the data value is "1", the transistor 322 is in a strong inversion mode, so that the capacitance Cgs that contributes to the increase in potential of the node N31 includes, in addition to the capacitance Cos, capacitance Cod generated between the gate electrode and a drain electrode and part of capacitance Cox generated between a channel formation region and the gate electrode.

Thus, the capacitance Cgs that contributes to the increase in potential of the node N31 at the time when the configuration data is "1" is larger than the capacitance Cgs at the time when the configuration data is "0." Accordingly, the case where the data value "1" is written to the memory cell 310 is more effective in increasing the potential of the node N31 than the case where the data value "0" is written to the memory cell 310. Consequently, in the case where the written configuration data is "1", the switching speed of the transistor 321 is increased. In the case where the written configuration data is "0", unnecessary conduction of the transistor 322 does not occur, and the transistor 322 is kept off.

<1.4.2. Operation of Switch Circuit>

A method for writing the data value "1" to the memory cell 310 is described. After the high-level signal Bsw (data value "1") is input to the wiring 311, the high-level signal Wsw is input to the wiring 313 to turn on the transistor 321 for a certain period. Then, a high-level potential is written to the node N31. After that, by turning off the transistor 321, the potential of the transistor 321 is held in the node N31.

In contrast, in the case where the data value "0" is written to the memory cell 310, after the low-level signal Bsw (data value "0") is input to the wiring 311, the high-level signal Wsw is input to the wiring 313 to turn on the transistor 321 for a certain period. Then, a low-level potential is written to the node N31. After that, by turning off the transistor 321, the potential of the transistor 321 is held in the node N31.

When a signal Wsw[0] is set to a high level, configuration data corresponding to the first context is written to Cellsw[0]. When a signal Wsw[1] is set to a high level, configuration data corresponding to the second context is written to Cellsw[1].

In configuration data stored in the memory cell 310, the data value "1" means the case where LE[0] is connected to LE[1], and the data value "0" means the case where LE[0] is not connected to LE[1]. Changing of connection between LE[0] and LE[1] is controlled by the signal Rsw. The signal Rsw is also a control signal for a context switch.

The signal Rsw input to the wiring 314 turns on the transistor 323. When the potential of the node N31 is a high level, the transistor 322 is on; thus, the wiring 312 is connected to the wiring 315. In contrast, when the potential of the node N31 is a low level, the transistor 322 is off; thus, the wiring 312 is not connected to the wiring 315.

Setting a signal Rsw[0] to a high level corresponds to switching configuration data to the first context, and setting a signal Rsw[1] to a high level corresponds to switching configuration data to the second context. By switching the contexts while the PLD 100 operates, dynamic reconfiguration of connection between the logic elements 110 can be performed.

<1.5. Logic Element>

The logic element 110 includes a combinational circuit, a flip-flop (register), a logic element, and the like. An example of the combinational circuit is a look-up table. Structure examples of the logic element 110 are described with reference to block diagrams in FIGS. 7A to 7C.

The logic element 110 in FIG. 7A includes a look-up table 111 (hereinafter referred to as an LUT 111) and a flip-flop 112 (FF). The circuit structure of the LUT 111 is changed by configuration data output from the memory 120. One output value of the LUT 111 is determined for a data value input to an input terminal 115. The flip-flop 112 holds a signal output from the LUT 111 and outputs held data from output terminals 116 and 117 in synchronization with a clock signal CLK.

Figure 7A:
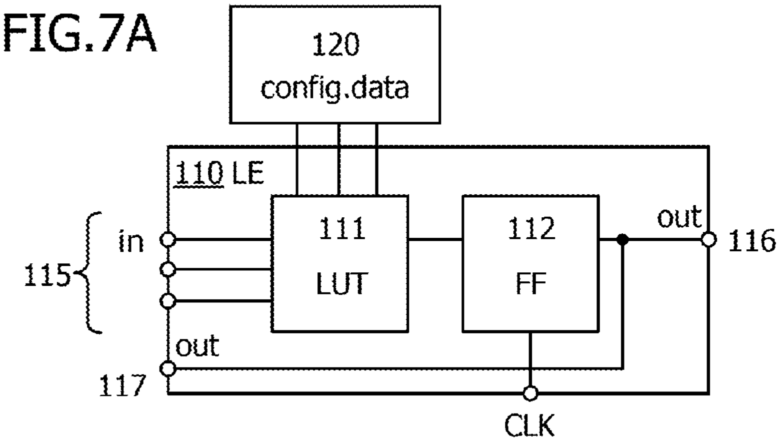
FIGS. 7A to 7C are block diagrams each illustrating a structure example of a logic element.
Figure 7B:
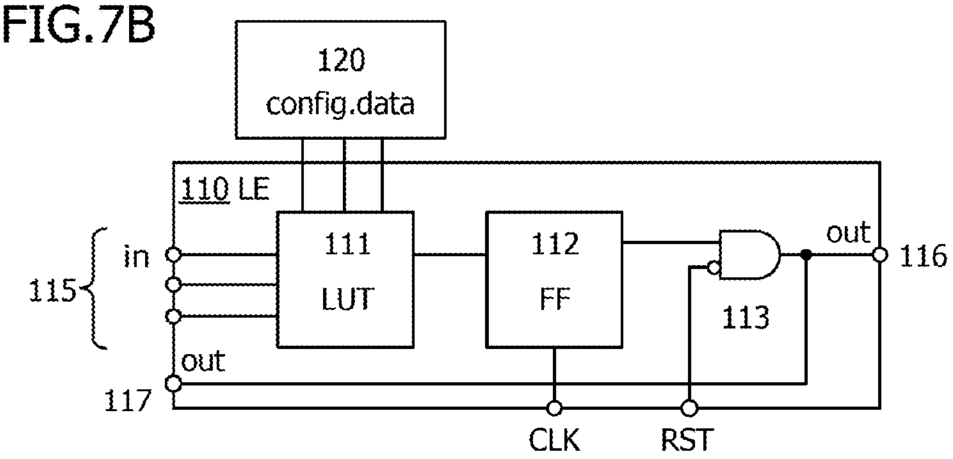

The logic element 110 in FIG. 7B is obtained by adding a circuit 113 to the circuit in FIG. 7A. A signal from the flip-flop 112 is input to the circuit 113 as a first input, and an inversion signal of an initialization signal RST is input to the circuit 113 as a second input.

Figure 7C:
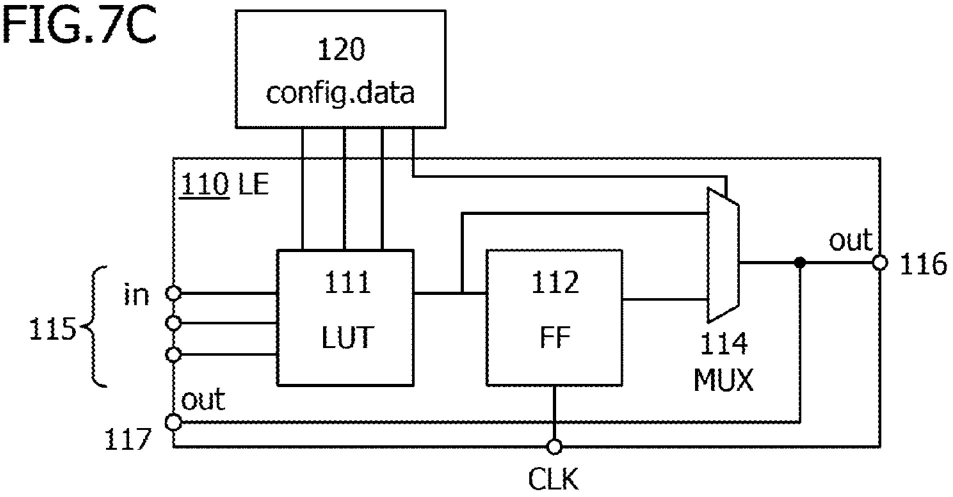

The logic element 110 in FIG. 7C is obtained by adding a multiplexer 114 (MUX) to the circuit in FIG. 7A. Configuration data is input from the memory 120 to the multiplexer 114, and output signals from the LUT 111 and the flip-flop 112 are input to the multiplexer 114. In accordance with configuration data stored in the memory 120, one of these two output signals is output from the multiplexer 114 to the output terminals 116 and 117.

In FIGS. 7A to 7C, configuration data can be output from the memory 120 to the flip-flop 112 so that the function of the flip-flop 112 can be changed. Specifically, the flip-flop 112 can be changed into a circuit functioning as any of a D flip-flop, a T flip-flop, a JK flip-flop, and an RS flip-flop depending on the configuration data.

Note that examples of applications to PLDs are described in this embodiment; however, one aspect of an embodiment of the present invention is not limited thereto. Depending on circumstances or conditions, applications to devices and circuits other than PLDs are possible. For example, applications to driver circuits and pixels for display devices and light-emitting devices are possible. For example, a display element, a display device which is a device including a display element, a light-emitting element, and a light-emitting device which is a device including a light-emitting element can employ various modes and can include various elements. For example, a display medium whose contrast, luminance, reflectivity, transmittance, or the like is changed by electromagnetic action, such as an EL (electroluminescence) element (e.g., an EL element including organic and inorganic materials, an organic EL element, or an inorganic EL element), an LED (e.g., a white LED, a red LED, a green LED, or a blue LED), a transistor (transistor which emits light in accordance with current), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube, can be used as a display element, a display device, a light-emitting element, or a light-emitting device. Examples of display devices having EL elements include an EL display. Examples of display devices having electron emitters include a field emission display (FED) and an SED-type flat panel display (SED: surface-conduction electron-emitter display). Examples of display devices having liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices having electronic ink or electrophoretic elements include electronic paper.

In this embodiment, the example in which a circuit (power gating circuit) having a function of switching the operating state (active or non-active) of a logic element with power gating is provided is described; however, one aspect of an embodiment of the present invention is not limited thereto. Depending on circumstances or conditions, it is possible not to provide a power gating circuit.

This embodiment can be combined with any of the other embodiments as appropriate.

Embodiment 2

In this embodiment, another structure example of the power gating circuit is described.

As in Embodiment 1, a power gating circuit in this embodiment has a function of switching the operating state (active or non-active) of a logic element and has a function of changing the value of a potential supplied to the logic element. The power gating circuit includes a switching regulator and a memory storing configuration data.

The switching regulator has a function of converting the input power supply potential VDD into a potential Vw that is needed for the operation of the logic element by switching a switch and outputting the potential Vw. The memory stores pieces of configuration data for setting the value of the potential Vw output from the switching regulator. The memory can store configuration data corresponding to a plurality of contexts. Specifically, the configuration data is data for setting the conduction state of the switch in the switching regulator.

The power gating circuit has a function of selecting any one of the pieces of configuration data stored in the memory and outputting the data to the switch. As a result, the duty ratio of on/off of the switch in the switching regulator is changed, so that the value of the potential Vw output from the switching regulator is changed.

Figure 8:
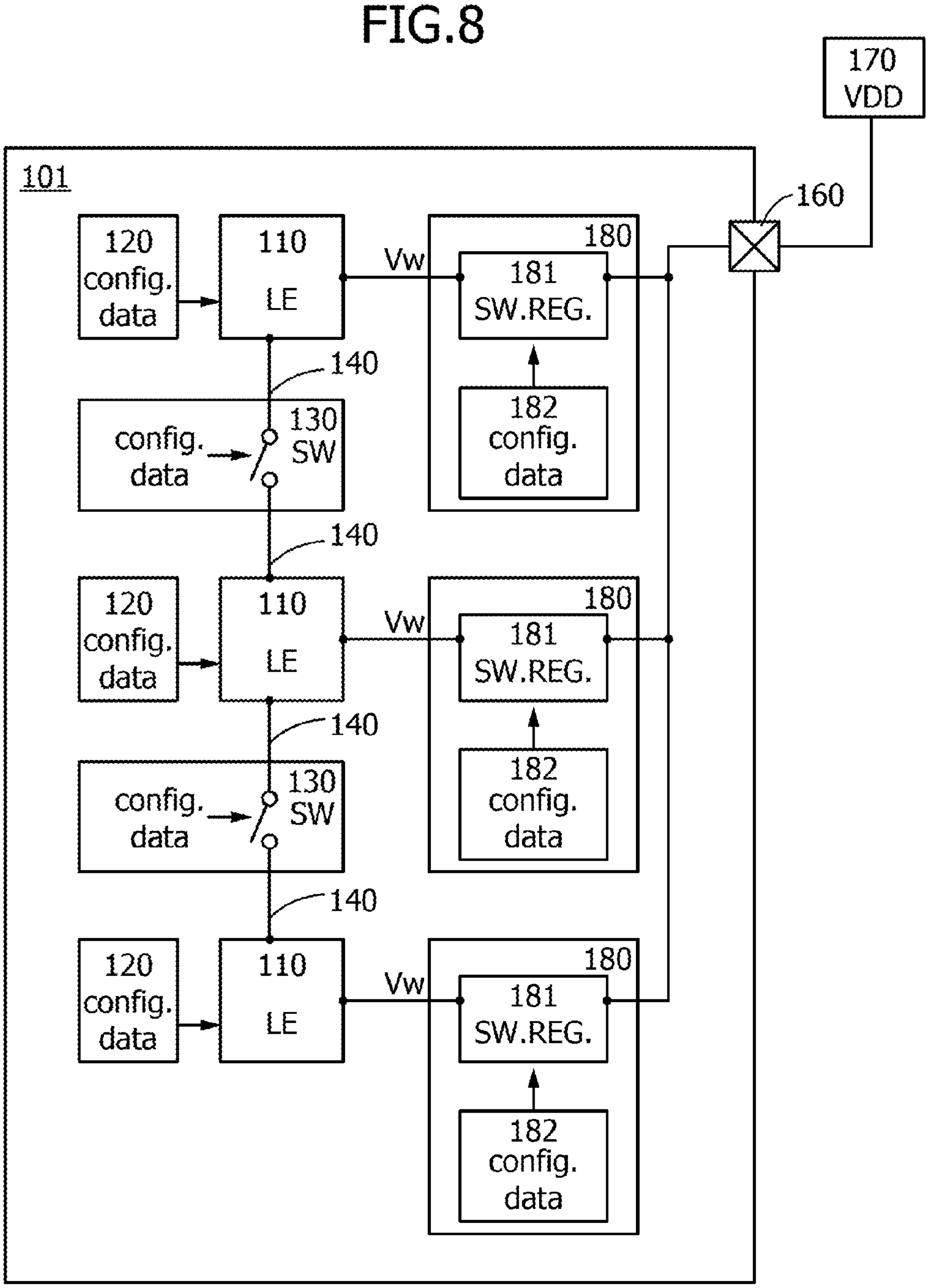
FIG. 8 is a block diagram illustrating a structure example of a programmable logic device.

FIG. 8 is a block diagram illustrating a structure example of a PLD. A PLD 101 is a dynamic reconfigurable processor. The PLD 101 includes the plurality of logic elements 110, the plurality of memories 120, the plurality of switch circuits 130, the plurality of wirings 140 connecting two logic elements 110 to each other, and a plurality of power gating circuits 180.

The power gating circuit 180 includes a switching regulator 181 and a memory 182. The switching regulator 181 has a function of converting the power supply potential VDD input from the terminal 160 into the potential Vw and outputting the potential Vw. The switching regulator 181 includes a switch. By changing the duty ratio of on/off of the switch in the switching regulator 181, the value of the potential Vw is changed.

The memory 182 can store pieces of configuration data (each corresponding to one context) for setting the conduction state of the switch in the switching regulator 181. The memory 182 can store configuration data corresponding to a plurality of contexts. Thus, the memory 182 includes a plurality of memory cells each having a function of storing one piece of configuration data, and for example, can be a circuit similar to that of the memory element 152 (see FIG. 2) or the memory element 121 (see FIG. 5).

It is not necessary to load data from outside the PLD 101 into the memory 182 because the memory 182 is a nonvolatile memory like the memory element 152 and the memory element 121. Accordingly, the startup operation of the PLD 101 and power consumption required to start up the PLD 101 can be reduced.

By switching configuration data (contexts) output from the memory 182, the on/off state of the switch in the switching regulator 181 can be switched. In other words, the duty ratio of on/off of the switch is changed; thus, by the switching regulator 181, whether to supply a potential to the logic element 110 can be determined and the value of the potential Vw output to the logic element 110 can be changed. As a result, according to this embodiment, it is possible to provide a PLD capable of performing fine-grained power supply control even while a system including the PLD 101 operates.

Embodiment 3

In this embodiment, a PLD is described as an example of a semiconductor device.

A PLD in this embodiment also has a function of switching the operating state (active or non-active) of a logic element with power gating. In this embodiment, a PLD in which a switch and a memory element for power gating are provided in a circuit block including a plurality of logic elements is described. This embodiment is described below with reference to FIG. 9, FIG. 10, FIG. 11, FIG. 12, and FIG. 13.

<2.1. Structure Example of PLD>

Figure 9:
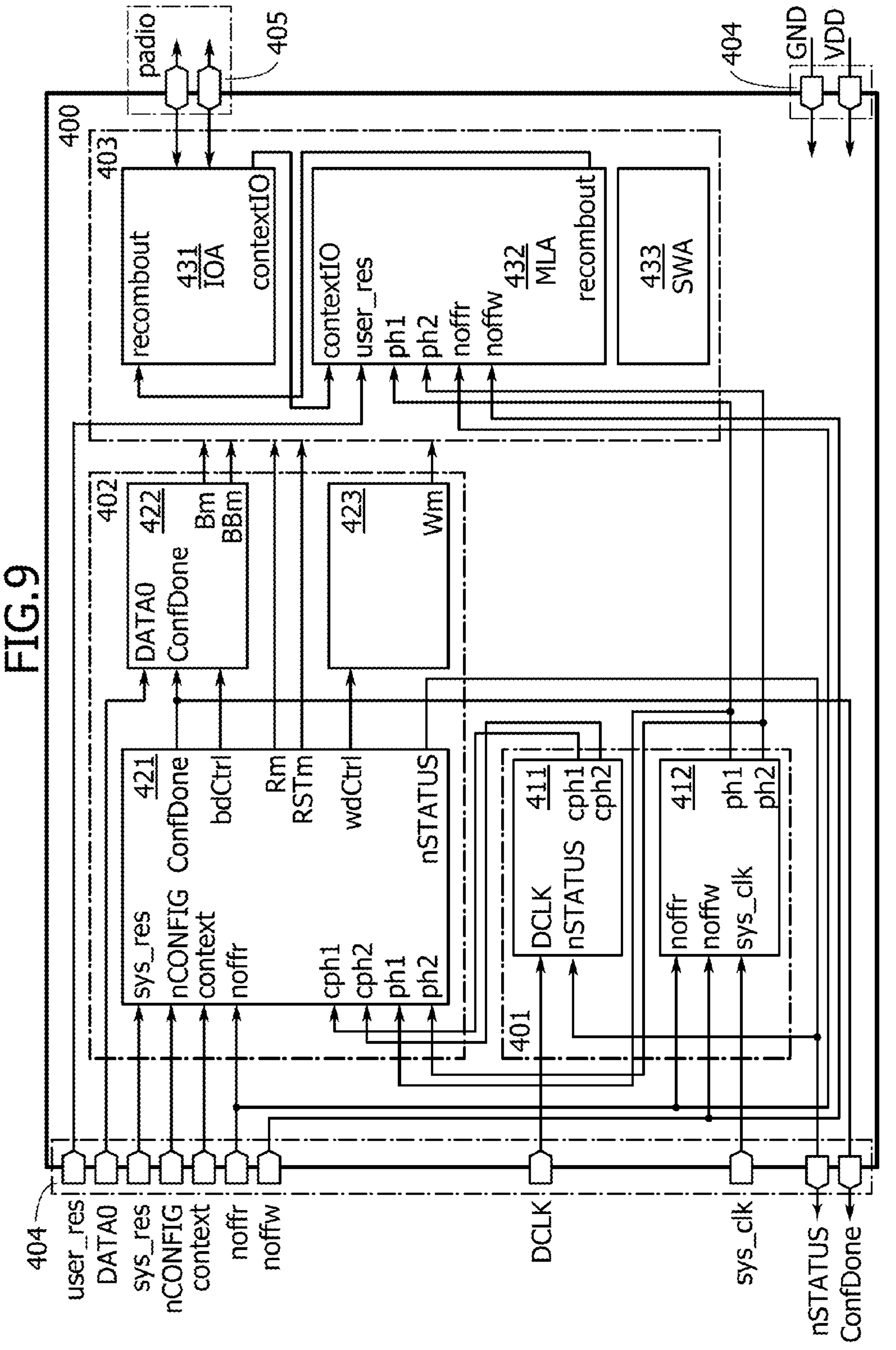
FIG. 9 is a block diagram illustrating a structure example of a programmable logic device.
Figure 10:
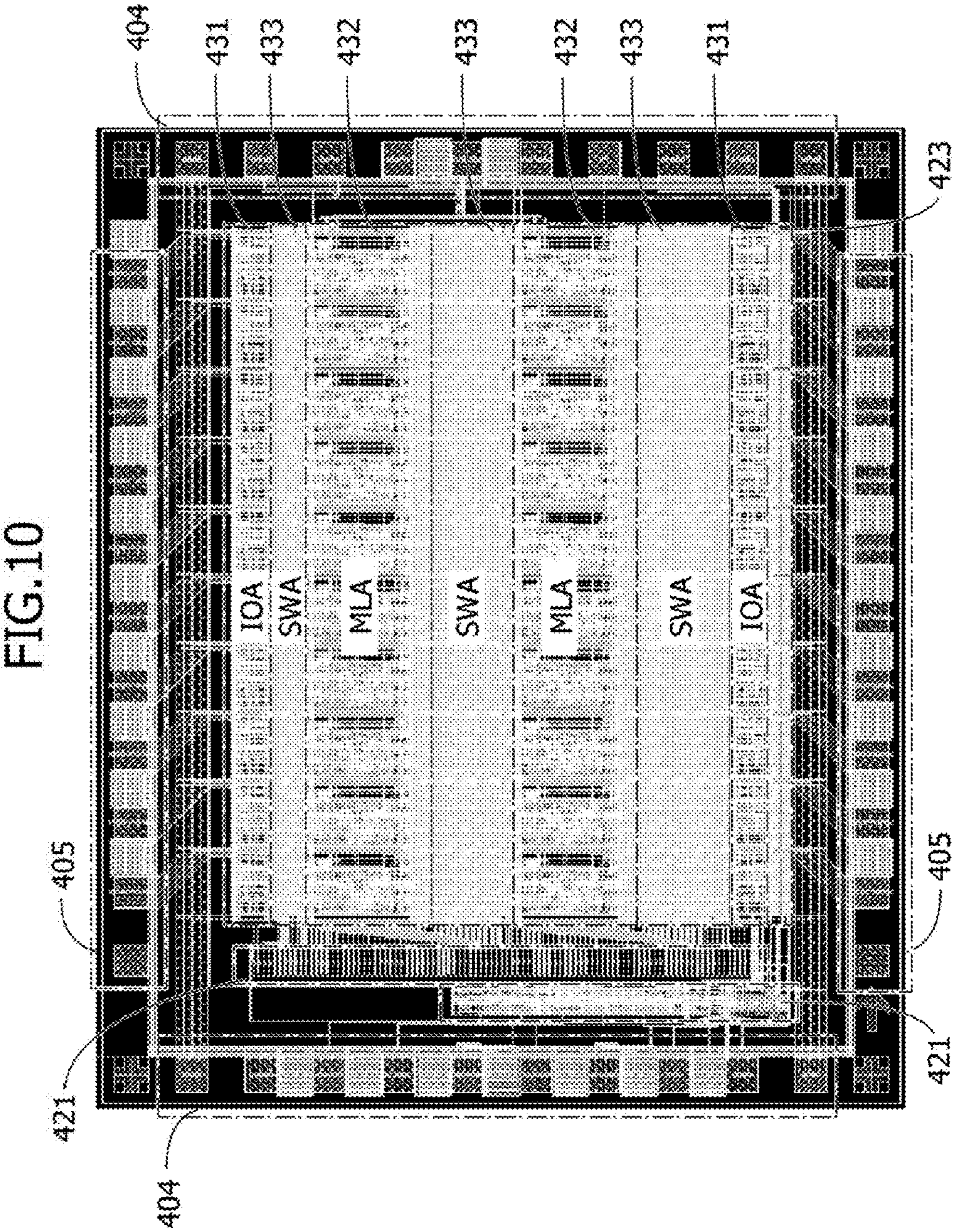
FIG. 10 illustrates a layout example of the programmable logic device in FIG. 9.

FIG. 9 is a block diagram illustrating a structure example of a PLD. FIG. 10 is a layout diagram of the structure example. Note that in FIG. 10, some components are denoted by symbols.

A PLD 400 includes three blocks 401 to 403 including a plurality of internal circuits, a terminal group 404, and a terminal group 405.

The terminal group 404 includes an input terminal of a power supply potential (e.g., GND or VDD), an input terminal of a signal (e.g., DATA0 or context) from an external circuit, and an output terminal of a signal (e.g., nSTATUS or ConfDone) generated in an internal circuit of the PLD 400. The terminal group 405 includes a plurality of user input/output terminals. Note that FIG. 9 illustrates some of signals and potentials input to the PLD 400 and signals output from the PLD 400.

The block 403 is a circuit block having a logical operation function and includes an IO array (10A) 431, a memory logic array (MLA) 432, and a switch array (SWA) 433.

The IO array (10A) 431 has an interface function for controlling transmission and reception of signals between the terminal group 405 and the internal circuit. The IO array 431 includes a plurality of input/output circuits corresponding to input/output terminals padio of the terminal group 405. Each input/output circuits has a function of controlling transmission of signals so that input signals do not collide with output signals in the input/output terminal padio. The input/output circuit is a programmable circuit and includes a memory storing configuration data. By changing the function of the input/output circuit, the function of the input/output terminal padio is changed.

The circuit block 432 includes reconfigurable logic elements and memory elements storing configuration data that are arranged in an array. Here, this circuit block is referred to as the memory logic array (MLA) 432. Signals user_res, noffr, and noffw input to the memory logic array 432 are control signals of registers (flip-flops) in the logic elements. An output recombout of the memory logic array 432 is connected to an input of the IO array 431.

The circuit block 433 has a function of controlling conduction between two logic elements in the memory logic array 432. Here, this circuit block is referred to as the switch array (SWA) 433. The switch array 433 also has a function of controlling conduction between the logic element and the input/output circuit of the IO array 431.

The switch array 433 includes a plurality of switch circuits arranged in an array. These switch circuits each have a function of connecting the logic element to another logic element or the input/output circuit of the IO array 431. The switch circuit is a programmable switch and includes a memory storing configuration data.

The block 402 is a configuration controller and includes a controller 421, a driver circuit 422, and a driver circuit 423. In other words, the block 402 is a circuit block having a function of controlling a memory for configuration data that is provided in the block 403.

The controller 421 is a controller for the entire block 402 and has a function of generating signals in response to input signals (e.g., cph1 and cph2). As signals input to the controller 421, a signal sys_res for resetting the PLD 400, a control signal nCONFIG for starting configuration, a signal context for controlling a context switch, and the like are given. Examples of signals generated in the controller 421 include a control signal bdCtrl of the driver circuit 422, a control signal wdCtrl of the driver circuit 423, a control signal Rm for a context switch, the signal RS™ for resetting an output of the memory to an initial value, a signal nSTATUS for notifying the start of the configuration, and a signal ConfDone for notifying the end of the configuration. The signals nSTATUS and ConfDone are output to the outside of the PLD 400 through the terminal group 404.

The driver circuit 422 and the driver circuit 423 each function as a signal line driver circuit of the memory. The driver circuit 422 functions as a driver circuit of a signal line (bit line) outputting configuration data. The driver circuit 422 has a function of generating the signals Bm and BBm in response to input signals (e.g., DATA0 and bdCtrl). The signal DATA0 corresponds to configuration data.

The driver circuit 423 functions as a driver circuit of a write control signal line (word line). The driver circuit 423 has a function of generating the signal Wm in response to an input signal (e.g., wdCtrl).

The control signals Bm, BBm, Wm, Rm, and RSTm generated in the block 402 are input to the memory of the block 403.

The block 401 is a clock signal generator. A clock oscillator 411 has a function of generating biphase clock signals cph1 and cph2 for the controller 421 in response to signals (e.g., DCLK and nSTATUS). The signal DCLK is a clock signal for configuration. A clock oscillator 412 has a function of generating biphase clock signals ph1 and ph2 in response to a clock signal sys_clk and the like of a system including the PLD 400.

<2.2. Connection Between Logic Elements>

Figure 11:
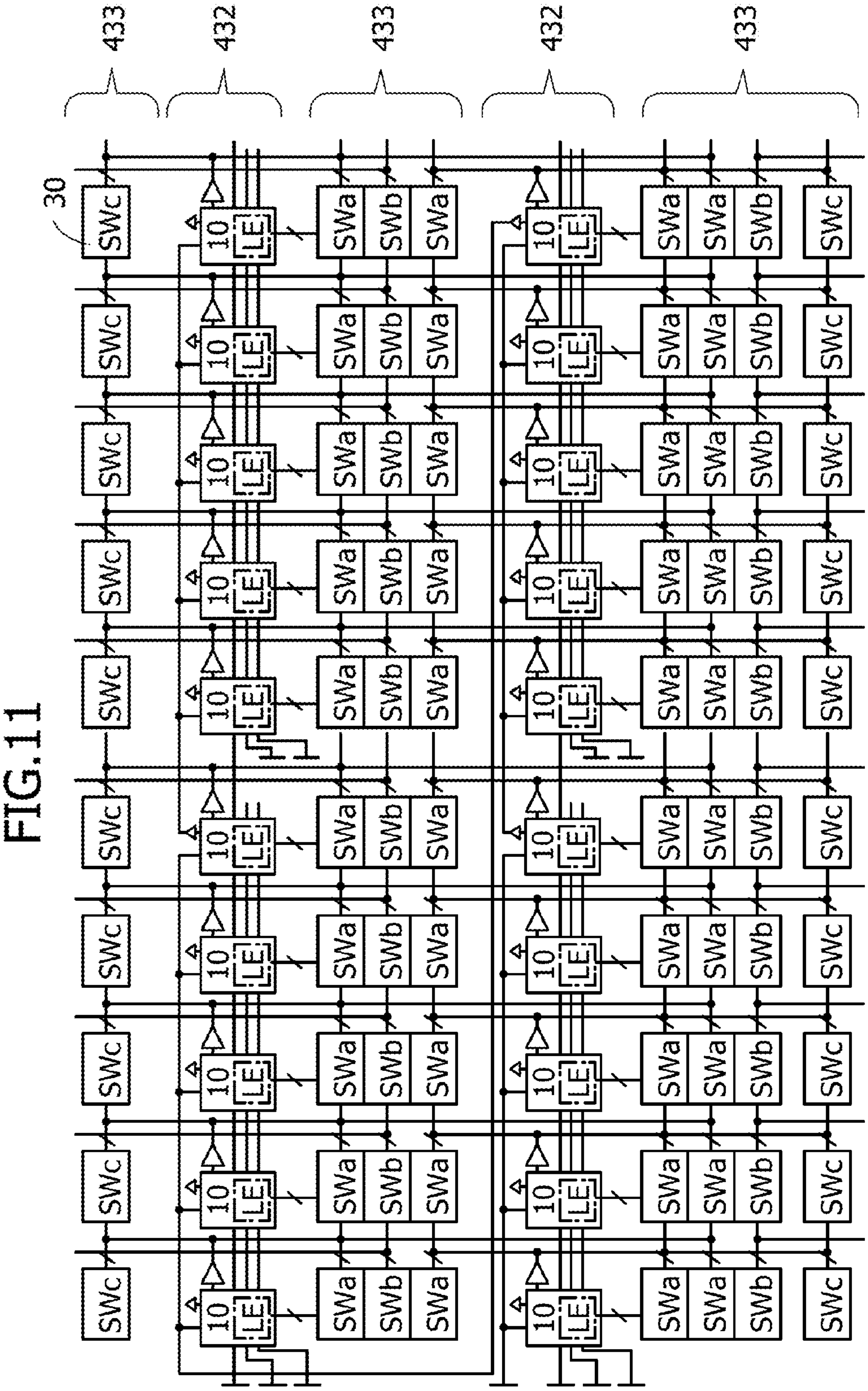
FIG. 11 is a block diagram illustrating structure examples of a memory logic array and a switch array in FIG. 9 and an example of connection between logic elements (LEs)

FIG. 11 is a block diagram illustrating structure examples of the memory logic array 432 and the switch array 433. FIG. 11 corresponds to the layout diagram of FIG. 10.

The memory logic array (MLA) 432 includes a plurality of fundamental elements 10 arranged in an array. In the example of FIG. 11, one memory logic array 432 includes ten fundamental elements 10 arranged in a line. The fundamental element 10 includes one logic element (LE) 11 and a memory storing configuration data for the logic element. The fundamental element 10 is hereinafter referred to as an ML element (MLE) 10.

The switch array 433 is a circuit block including a plurality of switch circuits 30 arranged in an array. In FIG. 11, a circuit SWa is the switch circuit 30 controlling conduction between two logic elements (LEs) 11; a circuit SWb is the switch circuit 30 controlling conduction between an input terminal of the logic element (LE) 11 and the input/output circuit of the IO array 431; and a circuit SWc is the switch circuit 30 controlling conduction between an output terminal of the logic element (LE) 11 and the input/output circuit of the IO array 431.

Each switch circuit 30 is a programmable switch and can be similar to the switch circuit 130 (see FIG. 6). A memory element storing configuration data of the switch circuit 30 is controlled by the circuits 431 to 433.

In the example of FIG. 11, in one memory logic array 432, a carry chain is constituted of look-up tables (LUTs) in five logic elements (LEs) 11, and a register chain is constituted of registers (flip-flops) in ten logic elements (LEs) 11.

<2.3. Structure Example of ML Element (MLE)>

Figure 12:
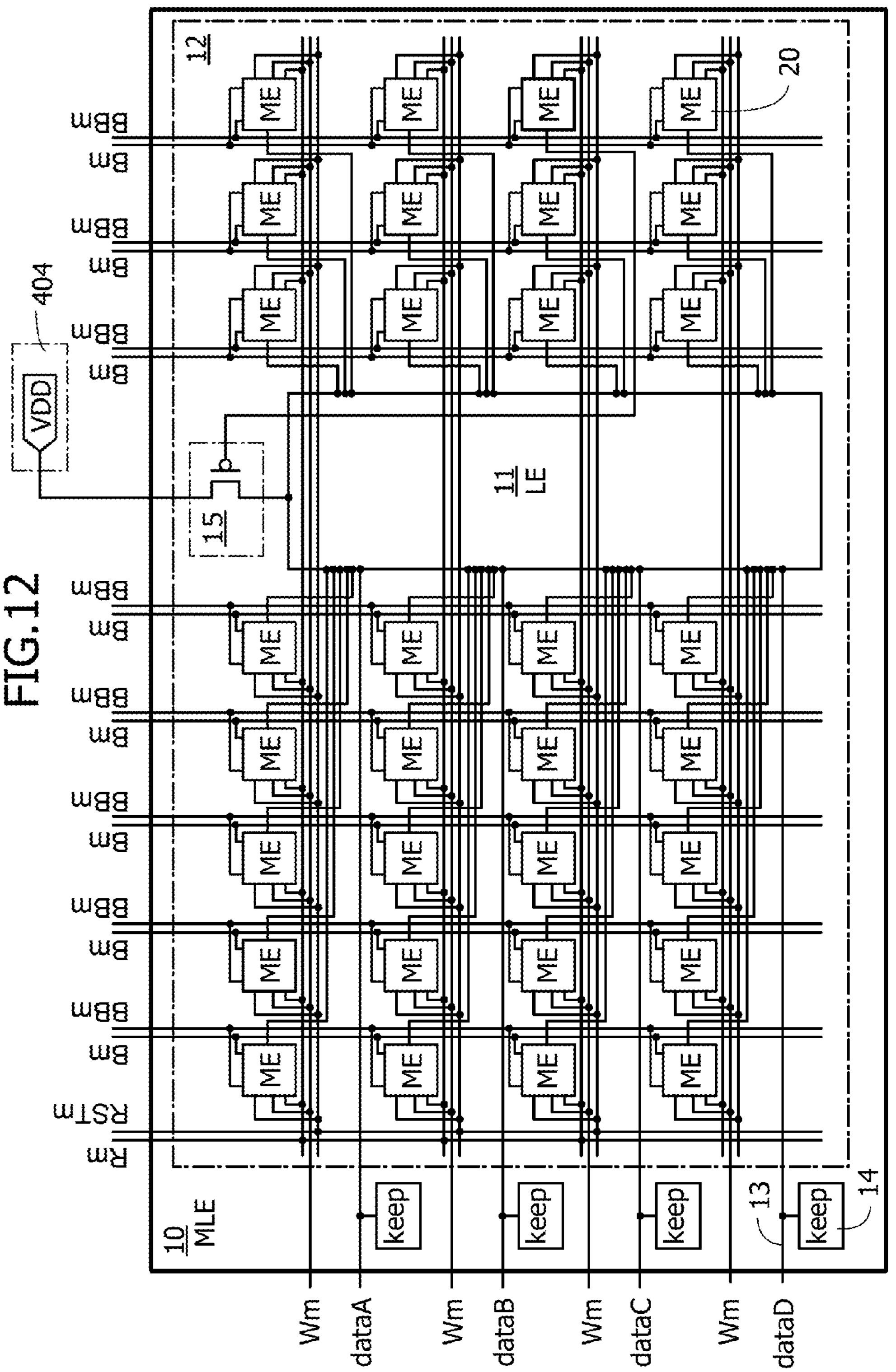
FIG. 12 is a block diagram illustrating structure examples of fundamental elements (ML elements) of the memory logic array in FIG. 9.

A structure example of the ML element (MLE) 10 is described with reference to FIG. 12. FIG. 12 is a block diagram illustrating the structure example of the ML element 10. The ML element 10 includes one logic element (LE) 11, a memory 12 storing configuration data of the logic element 11, and a latch circuit 14 (keep).

The logic element 11 is a logic circuit having four inputs and one output. Data A to D are signals input through the terminal group 405 by a user request. The latch circuit 14 is connected to a wiring 13 to which the data A to D are input. The latch circuit 14 includes an inverter and a p-channel transistor like the reset circuit 240 in FIG. 2 and has a function of inhibiting a voltage drop of the wiring 13.

The memory 12 can be similar to the memory 120 (see FIG. 5) and includes a plurality of memory elements (MEs) 20 arranged in an array. In the example of FIG. 12, thirty two memory elements 20 are arranged in an array (four rows by eight columns) The logic element 11 is provided in the array (memory 12) of the memory elements 20 between a fifth column and a sixth column.

The memory element 20 can store pieces of configuration data. With such a memory structure, dynamic reconfiguration of the logic element 11 can be performed. A circuit similar to the memory element 121 in the memory 120 (see FIG. 5) can be used as the memory element 20.

The ML element 10 has a power gating function of controlling power supply of the logic element 11. Here, a programmable switch circuit 15 is provided in the ML element 10. The conduction between the logic element 11 and an input terminal of VDD can be switched with the switch circuit 15; thus, whether to supply power can be determined in each logic element 11.

The switch circuit 15 can be similar to the switch circuit 151, and for example, can be a p-channel transistor. One memory element 20 in the memory 12 is used as a memory storing configuration data for setting the conduction state (on/off state) of the switch circuit 15. Thus, it is not necessary to separately provide a memory storing configuration data for power gating. Accordingly, the integration degree of the PLD 400 can be improved and cost can be reduced.

Note that in FIG. 12, the switch circuit 15 for power gating is provided in the circuit block as one component of the logic element 11; however, the switch circuit 15 can be provided outside the logic element 11 as a component different from the component of the logic element 11.

<2.4. Input/Output Circuit of IO Array>

Figure 13:
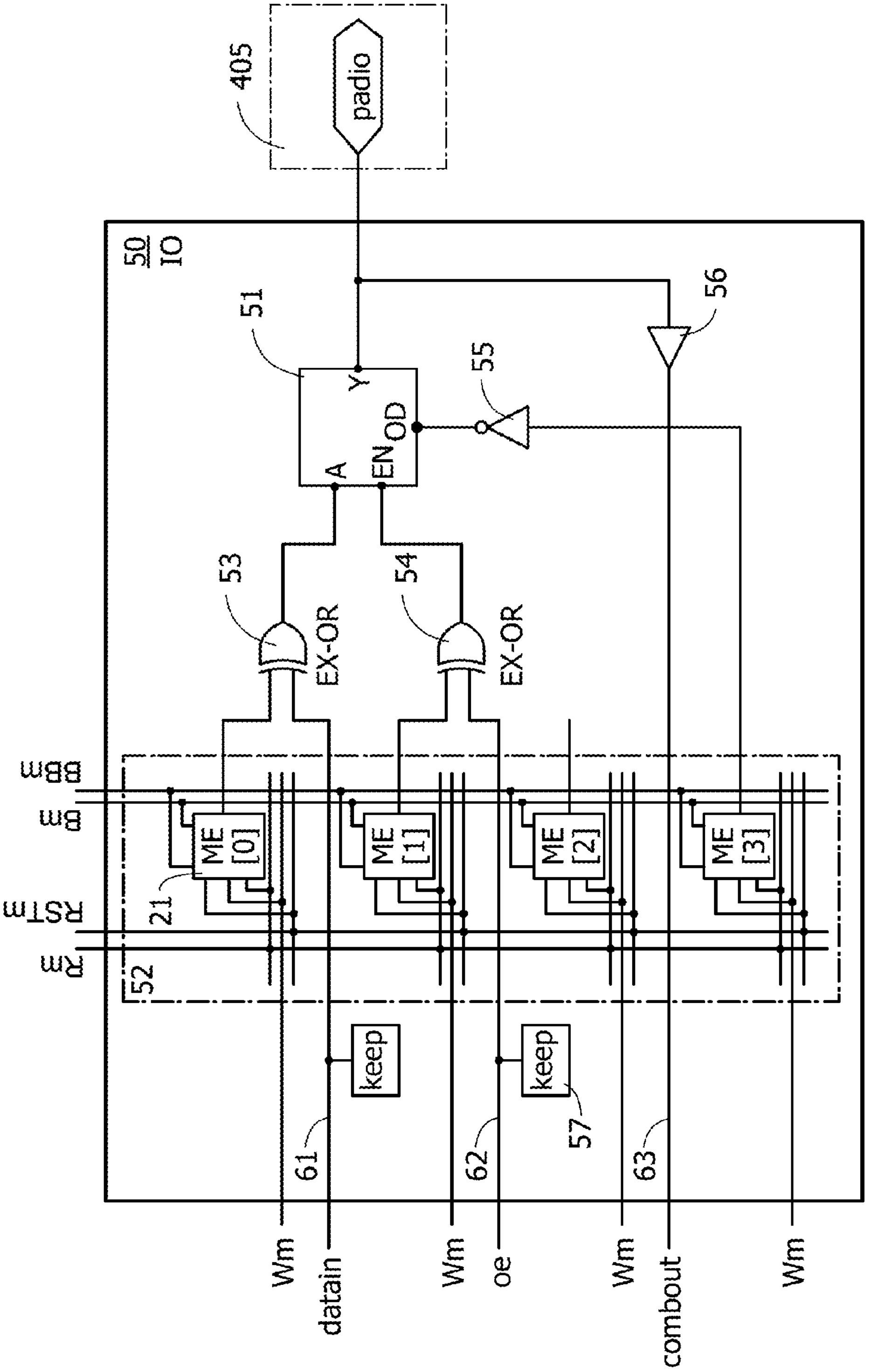
FIG. 13 is a circuit diagram illustrating a structure example of an input/output circuit included in an IO array in FIG. 9.

A specific structure of an input/output circuit (IO) 50 of the IO array 431 is described with reference to FIG. 13. FIG. 13 is a circuit diagram illustrating a structure example of the input/output circuit 50.

The input/output circuit 50 is a programmable circuit and includes an output circuit 51, a memory 52, an exclusive OR circuit 53, an exclusive OR circuit 54, an inverter 55, a buffer 56, and latch circuits 57. The latch circuits 57 (keep) are connected to a wiring 61 and a wiring 62. The latch circuit 57 is similar to the latch circuit 230 of the power gating circuit 150 and includes an inverter and a p-channel transistor. The latch circuit 57 can inhibit voltage drops of the wiring 61 and the wiring 62.

The output circuit 51 includes an input terminal A, an output terminal Y, and a terminal EN and a terminal OD to which control signals are input. A control signal (enable signal) for controlling whether to set the terminal Y to a high impedance state is input to the terminal EN. A control signal for controlling whether to operate the output circuit 51 as an open drain output circuit is input to the terminal OD. By these control signals, the circuit structure of the output circuit 51 can be changed into an open drain output circuit or a three-state output circuit.

While the data value “1” is input to the terminal OD, the output circuit 51 sets the potential of the terminal Y to a high level, a low level, or a high impedance state in response to input signals of the terminal A and the terminal EN. On the other hand, while the data value “0” is input to the terminal OD, the output circuit 51 functions as an open drain output circuit and sets the potential of the terminal Y to a low level or a high impedance state. When the potential of the terminal A is a low level and the potential of the terminal EN is a high level, the potential of the terminal Y is a low level and is a high impedance state in other periods.

Reconfiguration of the output circuit 51 is performed by configuration data output from the memory 52. The memory 52 is similar to the memory 12 and includes a plurality of memory elements (MEs) 21. Here, the memory 52 includes four memory elements 21 arranged in an array (four rows by one column). Like the memory element 20 of the memory 12, the memory element 21 can be similar to the memory element 121 (FIG. 5).

A signal datain and configuration data output from ME[0] are input to the exclusive OR circuit 53. A signal oe and configuration data output from ME[1] are input to the exclusive OR circuit 54. In the case where the configuration data output from ME[0] and ME[1] is “1”, the exclusive OR circuit 53 and the exclusive OR circuit 54 invert the signals datain and oe. Configuration data output from ME[3] is inverted by the inverter 55, and the inverted configuration data is input to the output circuit 51. Note that ME[2] in a third row is an unused memory element.

As described above, according to this embodiment, it is possible to provide a PLD having a function of switching an operating state (active or non-active) in each logic element with power gating.

This embodiment can be combined with any of the other embodiments as appropriate.

Embodiment 4

As described above, as a method for making a memory of a semiconductor device nonvolatile, a method for forming a potential hold portion and a routing switch for data input by using transistors including an oxide semiconductor can be used. Thus, in this embodiment, a semiconductor device that includes a transistor including an oxide semiconductor and a method for forming the semiconductor device are described.

<3.1. Structure Example of PLD>

Figure 14:
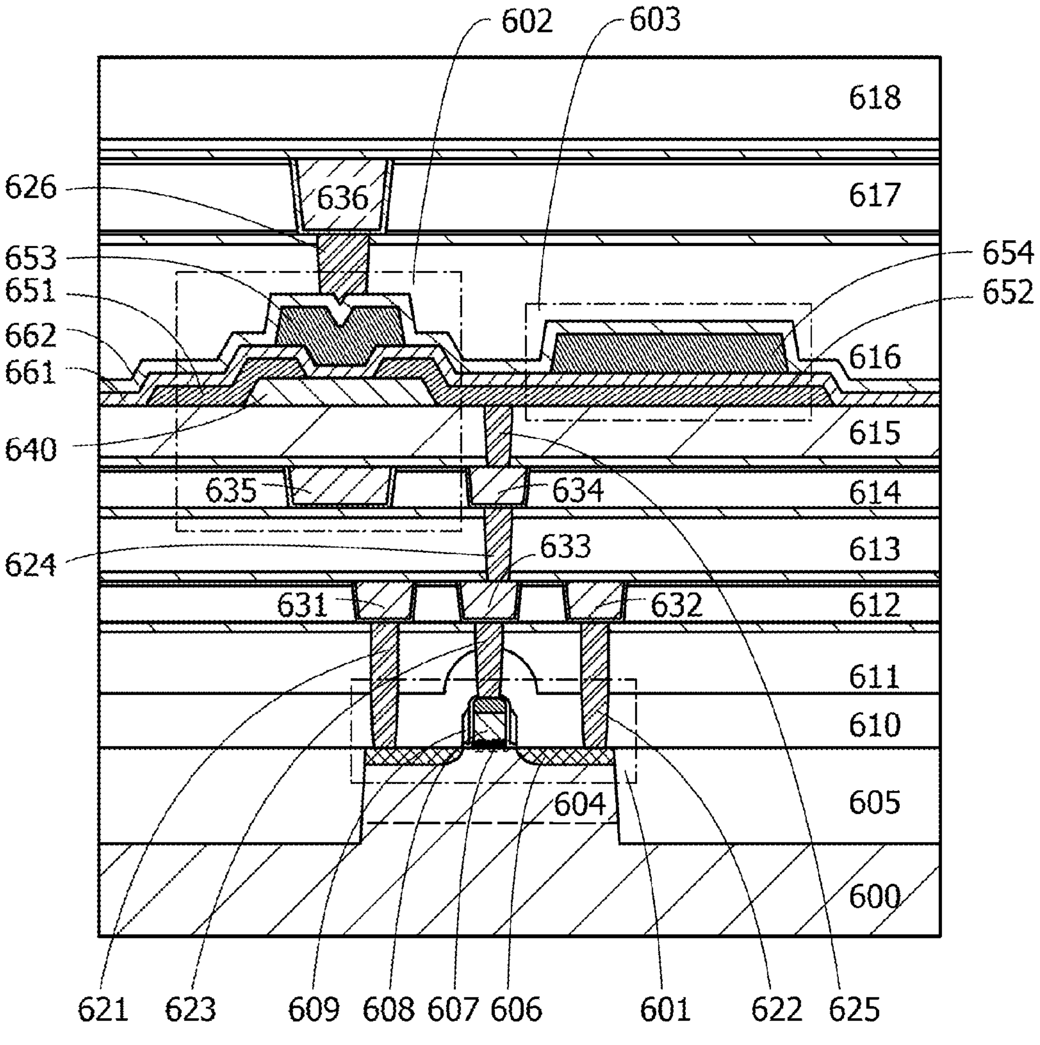
FIG. 14 is a cross-sectional view illustrating a structure example of a programmable logic device.

FIG. 14 is a cross-sectional view illustrating a structure example of a PLD. The cross-sectional view in FIG. 14 is not a cross-sectional view taken along a specific portion of the PLD but a cross-sectional view for illustrating a layered structure of the PLD. FIG. 14 illustrates only a transistor 601 formed using a single crystal silicon wafer 600 (hereinafter referred to as a wafer 600), a transistor 602 including an oxide semiconductor, and a capacitor 603. All the portions of the PLD (excluding a potential hold portion of a memory and a transistor connecting wirings for data input) include transistors formed using a single crystal silicon wafer. The transistor 601 is a typical example of such a transistor.

Here, the transistor 601, the transistor 602, and the capacitor 603 are formed in a memory cell. For example, the transistor 601, the transistor 602, and the capacitor 603 correspond to the transistor 262, the transistor 261, and the capacitor 266 of the memory cell 260 in FIG. 5, respectively.

A well 604 and a shallow trench isolation (STI) 605 are formed on the wafer 600. The well 604 is a region formed by addition of an impurity imparting conductivity, such as boron, phosphorus, or arsenic. The STI 605 is a region for element isolation. The use of the STI 605 can inhibit generation of a bird’s beak in an element isolation region that is caused in an LOCOS element isolation method, and can reduce the size of the element isolation region. On the other hand, in a semiconductor device that is not required to be structurally miniaturized or downsized, the STI 605 is not necessarily formed, and an element isolation method such as LOCOS can be used.

The transistor 601 includes a channel formation region, an impurity region 606, an insulating layer 607, and a conductive layer 608 that are formed in the well 604. The insulating layer 607 forms a gate insulating layer of the transistor 601. The conductive layer 608 forms a gate electrode of the transistor 601 and is a two-layer conductive film. A lower layer in the conductive layer 608 is a conductive layer with high processing accuracy, and an upper layer in the conductive layer 608 is a conductive layer for reducing resistance. For example, the lower layer can be formed using crystalline silicon to which an impurity imparting conductivity, such as phosphorus, is added, and the upper layer can be formed using nickel silicide. Insulating layers 609 functioning as sidewalls are formed on sidewalls of the conductive layer 608 through the insulating film. By using this insulating film and the insulating layers 609, LDD regions or extension regions can be formed in a self-aligning manner.

The transistor 601 may be a fin-type transistor. In a fin-type structure, part of a semiconductor substrate is processed into a plate-like protrusion, and a gate electrode layer is provided to cross the protrusion in a longitudinal direction. The gate electrode layer covers an upper surface and side surfaces of the protrusion with a gate insulating film positioned between the gate electrode layer and the protrusion. With the transistor 601 having a fin-type structure, the channel width can be reduced to achieve higher integration of transistors.

A semiconductor wafer of germanium, silicon germanium, single crystal silicon carbide, or the like as well as silicon can be used for the transistor 601. In addition, an SOI semiconductor wafer as well as a bulk semiconductor wafer can be used.

The transistor 601 can be formed using a crystalline semiconductor film (e.g., a silicon film) formed over an insulating substrate (e.g., a glass substrate or a quartz substrate).

The transistor 601 is covered with an insulating layer 610. The insulating layer 610 can function as a protective film and can prevent impurities from entering the channel formation region from the outside. With the insulating layer 610 formed by PECVD using silicon nitride or the like, hydrogenation can be performed by heat treatment in the case where single crystal silicon is used for the channel formation region. When an insulating film having tensile stress or compressive stress is used for the insulating layer 610, distortion can be caused in the semiconductor material in the channel formation region. By application of tensile stress to a silicon material used for the channel formation region of an n-channel transistor or application of compressive stress to a silicon material used for the channel formation region of a p-channel transistor, the field-effect mobility of the transistor can be increased.

A plurality of insulating layers 611 to 618 are formed to cover the insulating layer 610. Surfaces of the insulating layers are flattened by CMP.

The insulating layers 611 to 618 can be formed using silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), silicon oxide made from $Si(OC_2H_5)_4$ (tetraethylorthosilicate: TEOS), hydrogen silsesquioxane (HSQ), methyl silsesquioxane (MSQ), organosilicate glass (OSG), an organic polymer-based material, or the like. In particular, in the case where the semiconductor device is downsized, parasitic capacitance between wirings is significant and signal delay is increased. Thus, the insulating layers 611 to 617 are preferably formed using a material with low relative permittivity. Specifically, the insulating layers 611 to 617 are preferably formed using a material having a relative permittivity (k) of 3.0 or lower, which is lower than the relative permittivity of silicon oxide (k=4.0 to 4.5).

In FIG. 14, a single-layer or multi-layer insulating layer is provided over an upper surface of each of the insulating layers 611, 612, 613, 614, 616, and 617. These insulating layers function as barrier layers for preventing diffusion of a wiring material of copper or the like or protective layers at the time when conductive films formed over the insulating layers 611 to 614 are polished, for example.

The insulating layer 618 is provided in the top layer and functions as a protective film for preventing moisture and contaminants from entering the semiconductor device from the outside. The insulating layer 618 can have a single-layer structure or a layered structure using a material such as silicon nitride, silicon oxynitride, or silicon nitride oxide.

Contact plugs 621 to 623 are formed in the insulating layers 610 and 611. A contact plug 624 is formed in the insulating layer 613. A contact plug 625 is formed in the insulating layer 615. Wiring layers 631 to 633 are formed in the insulating layer 612. Wiring layers 634 and 635 are formed in the insulating layer 614. A wiring layer 636 is formed in the insulating layer 617.

The contact plugs 621 to 625 and a contact plug 626 are formed by forming openings (via holes) having high aspect ratios and burying conductive materials such as conductive polysilicon doped with tungsten, phosphorus, or the like in the insulating layers 610 to 617.

The wiring layers 631 to 636 are preferably formed using a low-resistance conductive material such as copper or aluminum, for example. Alternatively, the wiring layers 631 to 636 can be formed using graphene formed by PECVD as a conductive material. Graphene is a one-atom thick sheet of $sp^2$-bonded carbon molecules or a stack of 2 to 100 sheets of the carbon molecules. Examples of a method for manufacturing such graphene are thermal CVD by which graphene is formed on a metal catalyst; and PECVD by which graphene is formed from methane, without using a catalyst, by plasma generated locally with ultraviolet light irradiation.

By using such a low-resistance conductive material, RC delay of signals transmitted through the wiring layers can be reduced. When copper is used for the wiring layers, a barrier film is formed in order to prevent copper from diffusing into the channel formation region. The barrier film can be a tantalum nitride film, a stack of a tantalum nitride film and a tantalum film, a titanium nitride film, or a stack of a titanium nitride film and a titanium film, for example, but is not limited to the film of these materials as long as its function of preventing diffusion of a wiring material and its adhesion to the wiring material, a base film, or the like are secured. The barrier film may be formed as a layer that is separate from the wiring layer, or may be formed in such a manner that a material of the barrier film is included in a wiring material and precipitated by heat treatment on an inner wall of an opening provided in an insulating film.

The transistor 602 including an oxide semiconductor film and the capacitor 603 are formed over the insulating layer 615. The transistor 602 and the capacitor 603 are connected to the transistor 601 through the contact plug 624, the contact plug 625, the wiring layer 633, and the wiring layer 634.

The transistor 602 includes a layer 640, conductive layers 651 to 653, and an insulating layer 662. The layer 640 may have a single-layer structure or a multi-layer structure of a plurality of stacked films and includes at least one oxide semiconductor film included in a channel formation region of the transistor 602.

The transistor 602 further includes the wiring layer 635 functioning as a back gate electrode. The wiring layer 635 functions as a potential supply line for controlling the threshold voltage of the transistor 602. The wiring layer 635 is provided as needed.

The conductive layer 653 forms a gate electrode of the transistor 602. The conductive layer 653 is connected to the wiring layer 636 through the contact plug 626. The wiring layer 636 forms a wiring to which the write control signal Wm of the memory element is input.

The capacitor 603 includes conductive layers 652 and 654 and an insulating layer 661. The conductive layers 652 and 654 form terminals of the capacitor 603, and the insulating layer 661 forms a dielectric substance.

The conductive layer 652 also forms a node serving as a potential hold portion.

<3.2. Method for Forming Transistor and Capacitor>

An example of a method for forming the transistor 602 and the capacitor 603 is described below.

An oxide semiconductor film is formed over the insulating layer 615 and is etched to form the layer 640. The oxide semiconductor film can be formed by sputtering, CVD, a molecular beam epitaxy (MBE) method, an atomic layer deposition (ALD) method, a pulse laser deposition (PLD) method, or the like.

As the oxide used for the layer 640, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide.

Note that an In—Ga—Zn oxide means an oxide whose main components are In, Ga, and Zn, and there is no limitation on the ratio of In, Ga, and Zn. The In—Ga—Zn oxide may contain a metal element other than In, Ga, and Zn. The same applies to other oxides.

As the oxide semiconductor film, a film formed using an oxide represented by $InMO_3(ZnO)_m$ can also be used. Note that M represents one or more metal elements selected from Ga, Fe, Mn, or Co. Alternatively, a material represented by $In_2SnO_5(ZnO)$, can be used.

The oxide semiconductor film is preferably an oxide film containing at least indium (In) or zinc (Zn). In order to reduce variations in electrical characteristics of the transistor 602 including the oxide semiconductor film, the oxide may contain an element functioning as a stabilizer.

As a stabilizer, gallium (Ga), tin (Sn), hafnium (Hf), aluminum (Al), zirconium (Zr), or the like can be used. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be used.

Note that the oxide semiconductor film is preferably formed by sputtering. RF sputtering, DC sputtering, AC sputtering, or the like can be used as sputtering. In particular, DC sputtering is preferably used because dust generated in the deposition can be reduced and the film thickness can be uniform.

The structure of the oxide semiconductor film is described below. Note that in the description of a crystal structure, the term "parallel" indicates that an angle formed between two straight lines is −10 to 10°, and accordingly includes the case where the angle is −5 to 5°. In addition, the term "perpendicular" indicates that an angle formed between two straight lines is 80 to 100°, and accordingly includes the case where the angle is 85 to 95°.

The oxide semiconductor film may be a single-crystal oxide semiconductor film or a non-single-crystal oxide semiconductor film. The non-single-crystal oxide semiconductor film means any of an amorphous oxide semiconductor film, a microcrystalline oxide semiconductor film, a polycrystalline oxide semiconductor film, a c-axis aligned crystalline oxide semiconductor (CAAC-OS) film, and the like.

Note that the oxide semiconductor film may be a stacked film including two or more films of an amorphous oxide semiconductor film, a microcrystalline oxide semiconductor film, and a CAAC-OS film, for example.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) of greater than or equal to 1 nm and less than 10 nm, for example. Thus, the microcrystalline oxide semiconductor film has higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit into a cube whose one side is less than 100 nm. Thus, there is a case where a crystal part included in the CAAC-OS film fits into a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

From the results of the cross-sectional TEM image and the planar TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (ϕ scan) is performed under conditions where the sample is rotated around a normal vector of a sample surface as an axis (ϕ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when ϕ scan is performed with 2ϕ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Further, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Further, when an impurity is added to the CAAC-OS film, the crystallinity in a region to which the impurity is added is changed, and the crystallinity in the CAAC-OS film varies depending on regions.

Note that when the CAAC-OS film with an $InGaZnO_4$ crystal is analyzed by an out-of-plane method, a peak of 2ϕ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor including the CAAC-OS film, changes in electrical characteristics of the transistor due to irradiation with visible light or ultraviolet light are small. Thus, the transistor has high reliability.

For example, a CAAC-OS film can be deposited by sputtering with a polycrystalline oxide semiconductor sputtering target. When ions collide with the sputtering target, a crystal region included in the sputtering target may be separated from the target along the a-b plane, and a sputtered particle having a plane parallel to the a-b plane (flat-plate-like sputtered particle or a pellet-like sputtered particle) might be separated from the sputtering target. In that case, the flat-plate-like sputtered particle or the pellet-like sputtered particle reaches a substrate while maintaining its crystal state, so that the CAAC-OS film can be deposited.

For the deposition of the CAAC-OS film, the following conditions are preferably employed.

By reducing the amount of impurities entering the CAAC-OS film during the deposition, the crystal state can be prevented from being broken by the impurities. For example, impurities (e.g., hydrogen, water, carbon dioxide, or nitrogen) which exist in a deposition chamber may be reduced. Further, impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches the substrate. Specifically, the substrate heating temperature during the deposition is 100 to 740° C., preferably 200 to 500° C. By increasing the substrate heating temperature during the deposition, when the flat-plate-like sputtered particle or the pellet-like sputtered particle reaches the substrate, migration occurs on the substrate, so that a flat plane of the sputtered particle is attached to the substrate.

Further, it is preferable to reduce plasma damage during the deposition by increasing the proportion of oxygen in the deposition gas and optimizing power. The proportion of oxygen in the deposition gas is 30 vol % or higher, preferably 100 vol %.

As an example of the sputtering target, an In—Ga—Zn compound target is described below.

A polycrystalline In—Ga—Zn compound target is made by mixing $InO_X$ powder, $GaO_Y$ powder, and $ZnO_Z$ powder in a predetermined mole ratio, applying pressure, and performing heat treatment at 1000 to 1500° C. Note that X, Y, and Z are each a given positive number. Here, the kinds of powder and the mole ratio for mixing powder may be changed as appropriate depending on a sputtering target to be formed.

Note that here, the layer 640 is an oxide semiconductor film having a single-layer structure; however, the layer 640 may have a multi-layer structure. For example, in the case of a three-layer structure, oxide films are preferably formed as a first layer and a third layer with the oxide semiconductor film positioned therebetween. Alternatively, in the case of a two-layer structure, an oxide film is preferably formed as a lower layer or an upper layer of the oxide semiconductor film.

In the layer 640 having a multi-layer structure, a channel is preferably formed mainly in the oxide semiconductor film. Thus, the energy of the bottom of the conduction band of the oxide film is preferably closer to the vacuum level than that of the oxide semiconductor film. For example, the energy of the bottom of the conduction band of the oxide film can be closer to the vacuum level than that of the oxide semiconductor film by 0.05 eV or higher and 2 eV or lower.

The oxide film can be formed using an oxide whose main component is the same as that of the oxide semiconductor film. For example, in the case where In—M—Zn oxide (M is Al, Ti, Ga, Y, Zr, La, Ce, Nd, or Hf) films are used as the oxide semiconductor film and the oxide film, the oxide film preferably has a lower atomic ratio of In to M and a higher atomic ratio of M to In than the oxide semiconductor film. The oxide film having such a composition can prevent diffusion of indium from the oxide semiconductor film.

After the layer 640 is formed, first heat treatment is preferably performed. The first heat treatment may be performed at a heating temperature of 250 to 650° C., preferably 300 to 500° C., in an inert gas atmosphere, an atmosphere containing an oxidizing gas at 10 ppm or more, or a reduced pressure atmosphere. Alternatively, the first heat treatment may be performed in such a manner that heat treatment is performed in an inert gas atmosphere, and then another heat treatment is performed in an atmosphere containing an oxidizing gas at 10 ppm or more in order to compensate desorbed oxygen. By the first heat treatment, the crystallinity of the oxide semiconductor film of the layer 640 can be improved and impurities such as hydrogen and water can be removed from the layer 640.

A highly purified oxide semiconductor (purified OS) obtained by reduction of impurities such as moisture or hydrogen that serve as electron donors (donors) and reduction of oxygen vacancies is an intrinsic (i-type) semiconductor or a substantially intrinsic semiconductor. Thus, a transistor including a channel formation region in a highly purified oxide semiconductor film has extremely low off-state current and high reliability. Consequently, in a process of forming the transistor 602, it is preferable to perform treatment such as the first heat treatment for highly purifying the oxide semiconductor film of the layer 640. Note that the first heat treatment may be performed before etching for forming the layer 640.

Next, one conductive film or two or more conductive films are formed over the layer 640 and etched to form the conductive layers 651 and 652. For the conductive film, Al, Cr, Cu, Ta, Ti, Mo, W or a conductive film containing any of these as a main component can be used. For example, a 100-nm-thick titanium nitride film is formed by sputtering or the like.

Then, second heat treatment is preferably performed. The second heat treatment can be performed in a condition similar to that of the first heat treatment. By the second heat treatment, impurities such as hydrogen and water can be removed from the layer 640.

The insulating layer 661 is formed to cover the conductive layers 651 and 652. The insulating layer 661 is formed using one insulating film or two or more insulating films. Examples of the insulating film used for the insulating layer 661 include insulating films containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

For the insulating layer 661, for example, a silicon nitride film may be formed as a first layer and a silicon oxide film may be formed as a second layer. In that case, a silicon oxynitride film may be formed as the first layer. In addition, a silicon nitride oxide film may be formed as the second layer. Oxynitride means a material that contains much oxygen than nitrogen, and nitride oxide means a material that contains much nitrogen than oxygen. A silicon oxide film whose defect density is low is preferably used as the silicon oxide film. Specifically, a silicon oxide film whose spin density attributed to a signal with a g factor of 2.001 in electron spin resonance is less than or equal to $3\times10^{17}$ spins/cm$^3$, preferably less than or equal to $5\times10^{16}$ spins/cm$^3$ is used. Further, the silicon oxide film preferably has excess oxygen. A silicon nitride film from which hydrogen and ammonia are less released is preferably used as the silicon nitride film. The amount of discharge of hydrogen or ammonia may be measured by TDS analysis.

After the insulating layer 661 is formed, it is preferable to perform a step of introducing oxygen into the insulating layer 661. Oxygen can be introduced by an ion implantation method, an ion doping method, a plasma immersion ion implantation method, or the like. Note that the number of times of the step of introducing oxygen is not particularly limited as long as the step is performed after formation of the insulating layer 661. The step of introducing oxygen may be performed after formation of the conductive layer 653 or after formation of the insulating layer 662.

The step of introducing oxygen is also one of treatments for highly purifying the oxide semiconductor film and is treatment for making at least one of the insulating layer 661 and the insulating layer 662 have excess oxygen. By forming the insulating film having excess oxygen in this manner, oxygen vacancies in the oxide semiconductor film of the layer 640 can be reduced.

Next, one conductive film or two or more conductive films are formed and etched to form the conductive layer 653 and the conductive layer 654. The conductive film can contain aluminum, titanium, chromium, cobalt, nickel, copper, yttrium, zirconium, molybdenum, ruthenium, silver, tantalum, or tungsten.

Then, the insulating layer 662 is formed using one insulating film or two or more insulating films. For example, the insulating film used for the insulating layer 662 is preferably a silicon nitride film or a silicon nitride oxide film. The insulating layer 662 can be formed by sputtering, CVD, MBE, ALD, or PLD. In particular, a silicon nitride film formed by sputtering is preferably used for the insulating layer 662 because the content of water or hydrogen in the film is low.

Third heat treatment is preferably performed after the formation of the insulating layer 662. The third heat treatment can be performed under a condition similar to that of the first heat treatment. The third heat treatment facilitates release of oxygen from the insulating layer 661 and the insulating layer 662, so that oxygen vacancies in the layer 640 can be reduced. In the case where the step of introducing oxygen is performed after the formation of the insulating layer 662, the step of introducing oxygen is performed before the third heat treatment.

Through the above steps, the transistor 602 and the capacitor 603 can be formed.

Although the conductive layer 608, contact plugs 621 to 626, wiring layers 631 to 636, and conductive layers 651 to 654 which are described in this embodiment can be formed by sputtering, these layers may be formed by another method, e.g., thermal CVD. A metal organic chemical vapor deposition (MOCVD) method or an atomic layer deposition (ALD) method may be employed as an example of thermal CVD.

For example, in the case where a tungsten film is formed using a deposition apparatus employing ALD, a $WF_6$ gas and a $B_2H_6$ gas are sequentially introduced more than once to form an initial tungsten film, and then a $WF_6$ gas and an $H_2$ gas are introduced at a time, so that a tungsten film is formed. Note that an $SiH_4$ gas may be used instead of a $B_2H_6$ gas.

This embodiment can be combined with any of the other embodiments as appropriate.

Embodiment 5

The programmable semiconductor device in the above embodiment can be used for processors in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy.

Examples of such electronic devices are display devices, personal computers, and image reproducing devices provided with recording media (devices that read image data of recording media such as digital versatile discs (DVDs) and have displays for displaying images). Other examples are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 15A to 15F illustrate specific examples of these electronic devices.

Figure 15A:
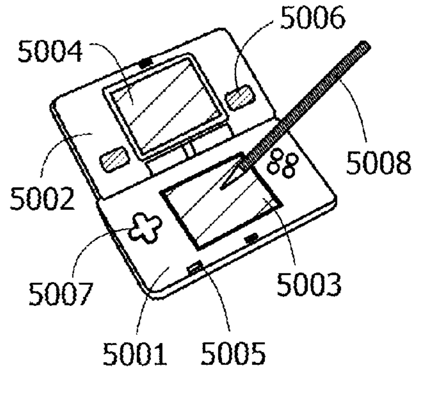
FIGS. 15A to 15F are external views illustrating structure examples of semiconductor devices.

FIG. 15A is an external view illustrating a structure example of a portable game machine. The portable game machine includes a housing 5001, a housing 5002, a display portion 5003, a display portion 5004, a microphone 5005, a speaker 5006, an operation key 5007, a stylus 5008, and the like.

Figure 15B:
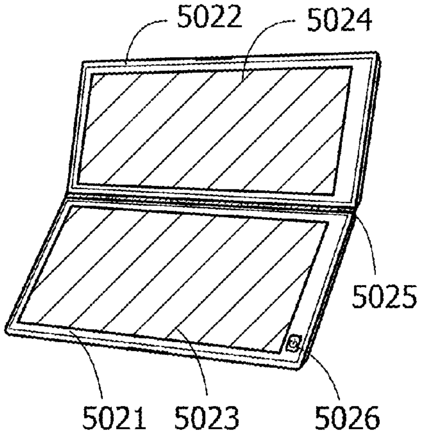

FIG. 15B illustrates a portable information terminal, which includes a housing 5021, a housing 5022, a display portion 5023, a display portion 5024, a joint 5025, an operation key 5026, and the like. The display portion 5023 is provided in the housing 5021, and the display portion 5024 is provided in the housing 5022. The housing 5021 and the housing 5022 are connected to each other with the joint 5025, and an angle between the housing 5021 and the housing 5022 can be changed with the joint 5025. An image on the display portion 5023 may be switched depending on the angle between the housing 5021 and the housing 5022 at the joint 5025. A display device with a position input function may be used as at least one of the display portion 5023 and the display portion 5024. Note that the position input function can be added by providing a touch panel in a display device. Alternatively, the position input function can be added by providing a photoelectric conversion element called a photosensor in a pixel portion of a display device.

Figure 15C:
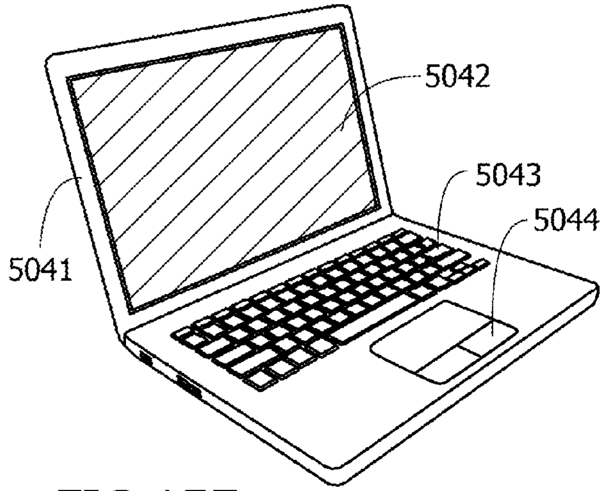

FIG. 15C is an external view illustrating a structure example of a laptop. The laptop includes a housing 5041, a display portion 5042, a keyboard 5043, a pointing device 5044, and the like.

Figure 15D:
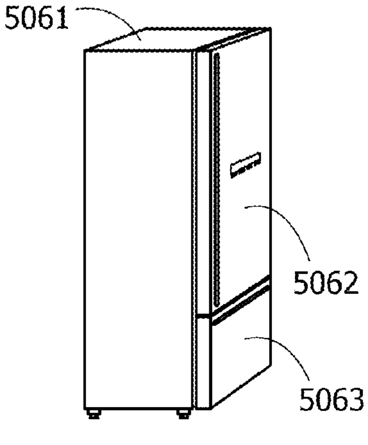

FIG. 15D is an external view illustrating a structure example of an electric refrigerator-freezer. The electric refrigerator-freezer includes a housing 5061, a refrigerator door 5062, a freezer door 5063, and the like.

Figure 15E:
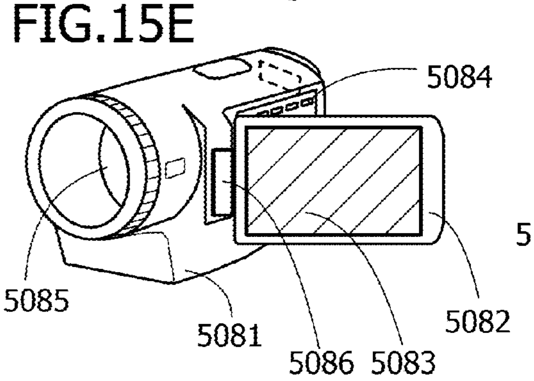

FIG. 15E is an external view illustrating a structure example of a video camera. The video camera includes a housing 5081, a housing 5082, a display portion 5083, operation keys 5084, a lens 5085, a joint 5086, and the like. The operation keys 5084 and the lens 5085 are provided in the housing 5081, and the display portion 5083 is provided in the housing 5082. The housing 5081 and the housing 5082 are connected to each other with the joint 5086, and an angle between the housing 5081 and the housing 5082 can be changed with the joint 5086. The direction of an image on the display portion 5083 may be changed and display and non-display of an image may be switched depending on the angle between the housing 5081 and the housing 5082.

Figure 15F:
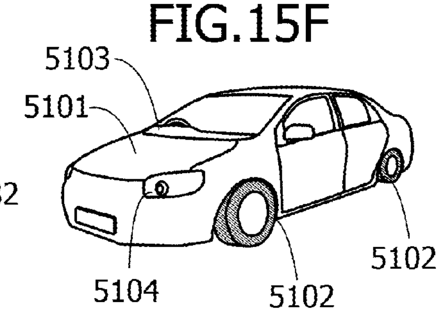

FIG. 15F is an external view illustrating a structure example of a motor vehicle. The motor vehicle includes a car body 5101, wheels 5102, a dashboard 5103, lights 5104, and the like.

Figure 16:
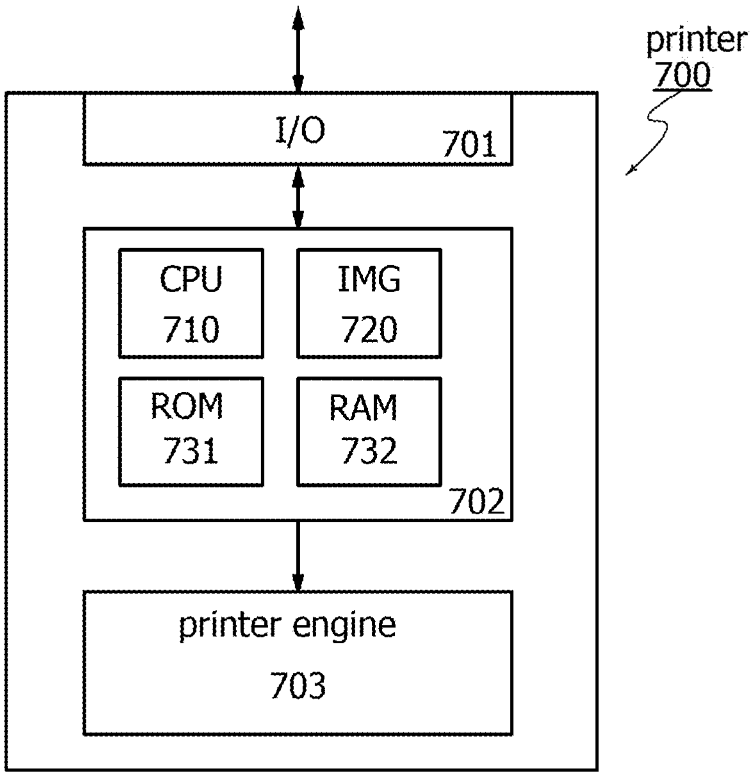
FIG. 16 is a block diagram illustrating a structure example of a printer.

Any of the PLDs in Embodiments 1 to 4 can be incorporated as an image processor (image processing circuit) in an electronic device that handles image data, such as a printer, a facsimile, a multifunctional printer, an image scanner, or a digital camera. Such an electronic device is described below giving a printer as an example. FIG. 16 is a block diagram illustrating a structure example of a printer.

A printer 700 includes an input/output interface 701 (I/O interface 701), a printer controller 702, a printer engine 703, and the like.

Through the input/output interface 701 (I/O interface 701), two-way communication between an external electronic device and the printer 700 can be performed. The communication between the printer 700 and the external device may be performed with or without wire.

The printer engine 703 is a mechanical unit for actually printing data. For example, when the printer 700 is a laser printer, the printer engine 703 includes a paper transfer mechanism, a photoconductive drum, a toner cartridge, and the like.

Print data transmitted from a host computer (e.g., a personal computer (PC)) is received in the input/output interface 701 and is transmitted to the printer controller 702. The printer controller 702 converts the received print data into image data and transmits the image data to the printer engine 703. The printer engine 703 prints the received image data on paper.

The printer controller 702 includes a CPU 710, an image processing circuit (IMG) 720, a ROM 731, a DRAM 732, and the like. The ROM 731 and the DRAM 732 store data, a program, and the like that are necessary for the CPU 710 and the image processing circuit 720 to execute processing.

The printer controller 702 analyzes print data in accordance with an image format and converts the analyzed print data into image data. The use of dedicated LSIs (ASICs) corresponding to image formats in image processing increase the price of the printer 700. When the image processing is only software processing using the CPU 710, there are problems in that processing time is long and that power consumption is high, for example.

Thus, in this embodiment, the image processing circuit 720 is provided in the printer controller 702, and the image processing circuit 720 is a programmable image processing circuit by using any of the PLDs described in Embodiments 1 to 4. A memory element of the image processing circuit 720 stores pieces of configuration data for determining a circuit structure corresponding to an image format. The image processing circuit 720 reads configuration data from the memory element as appropriate, and performs image processing with a circuit structure that is suitable for the image format.

In the case where the image processing circuit 720 is a multi-context PLD, a circuit structure can be changed in a short time when a circuit structure is changed into an optimal circuit structure in accordance with the image format of print data. In this manner, any of the PLDs in Embodiments 1 to 4 is preferably used as an image processing circuit executing a plurality of image processings.

Examples of image processings performed in the image processing circuit 720 include processing of converting print data into bitmap data, color conversion processing, compression/extension processing, and binarization processing.

Since a memory element for configuration data of the image processing circuit 720 is a nonvolatile memory, it is not necessary to save configuration data when supply of power to the image processing circuit 720 is stopped, and it is not necessary to rewrite the configuration data when the supply of power is restarted. Thus, the image processing circuit 720 has small power overhead and can operate at high speed.

Further, in a standby period of the printer 700, power may be supplied only to the I/O interface 701 detecting reception of print data, and supply of power to the printer controller 702 may be stopped. The standby period of the printer 700 is irregular. However, in the image processing circuit 720 in this embodiment, it is not necessary to rewrite configuration data at the time of startup; thus, image processing can be started at high speed.

This embodiment can be combined with any of the other embodiments as appropriate.

Example 1

A semiconductor device according to one embodiment of the present invention can perform fine-grained power gating. Since a multi-context FPGA (MC-FPGA) is formed and can perform fine-grained power gating, this example describes the MC-FPGA.

<Design and Manufacture>

Figure 17:
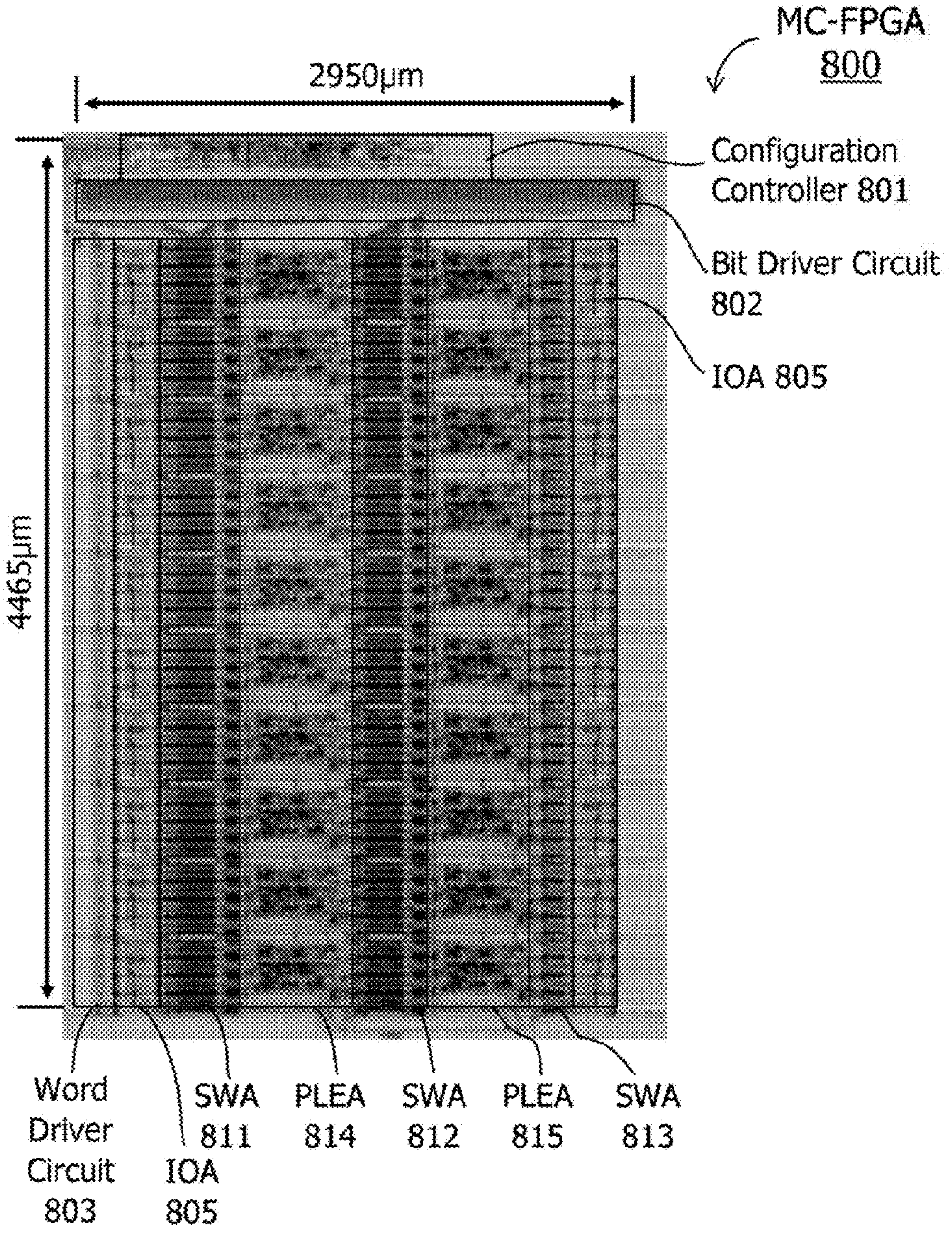
FIG. 17 is an optical micrograph of a chip of a fabricated multi-context FPGA (MC-FPGA)
Figure 18:
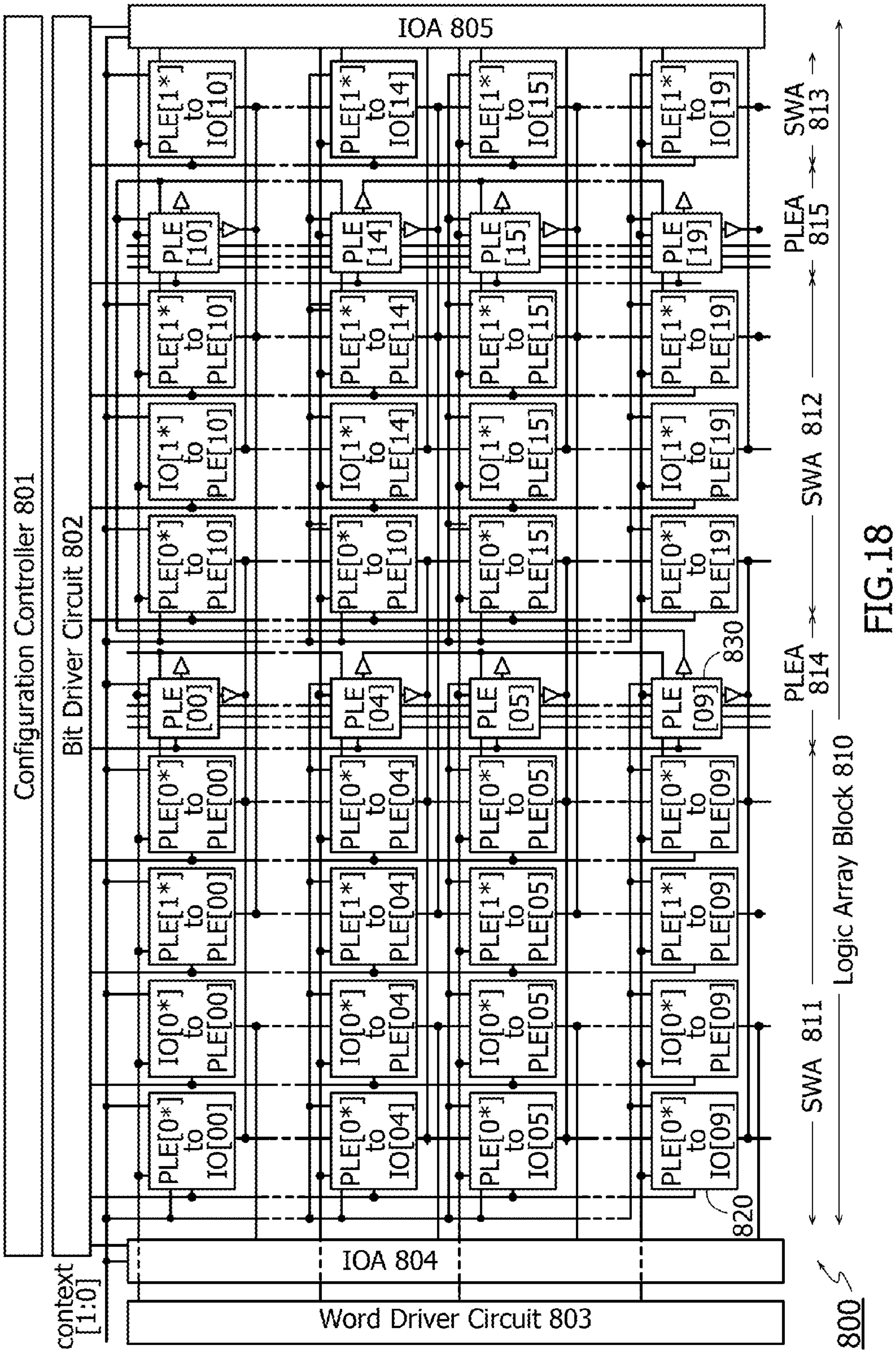
FIG. 18 is a circuit diagram of the MC-FPGA.

FIG. 17 is an optical micrograph of a formed MC-FPGA. FIG. 18 is a block diagram of the MC-FPGA.

(MC-FPGA)

The chip size of an MC-FPGA 800 is 4465 µm×2950 µm. As described in Embodiment 5, the MC-FPGA 800 includes OS transistors and single crystal Si transistors. Here, CAAC-OS is used for a semiconductor layer of the OS transistor. The OS transistor is formed by using an In—Ga—Zn oxide (IGZO) as an oxide semiconductor. The OS transistor included in the MC-FPGA 800 is hereinafter referred to as a CAAC-IGZO FET. In the MC-FPGA 800, the technology node of the CAAC-IGZO FET is 1.0 µm, and the technology node of the Si transistor is 0.5 µm.

As illustrated in FIG. 18, the circuit structure of the MC-FPGA 800 is similar to that of the PLD 400 in Embodiment 3 (e.g., FIG. 9 and FIG. 10). The MC-FPGA 800 includes a configuration controller 801, a bit driver circuit 802, a word driver circuit 803, arrays (IOAs) 804 and 805 each including a plurality of input/output (10) circuits, and a logic array block 810. The number of contexts in the MC-FPGA 800 is 2, and contexts are switched by context signals (context[0] and context[1]).

The bit driver circuit 802 and the word driver circuit 803 each have a function of generating a control signal of a configuration memory included in the logic array block 810. The configuration controller 801 has a function of controlling the driver circuits 802 and 803.

The logic array block 810 includes switch arrays (SWAs) 811 to 813 and programmable logic element arrays (PLEAs) 814 and 815.

The MC-FPGA 800 includes twenty programmable logic elements (PLEB) 830. The PLEA 814 includes ten PLEs[00] to [09], and the PLEA 815 includes ten PLEs[10] to [19].

The SWAs 811 to 813 include multi-path gate circuits (MPGs) 820 arranged in an array. The MPG 820 functions as a switch circuit connecting wirings to each other. Note that "PLE[0*] to IO[00]" in the block of the MPG 820 in the diagram indicate that when corresponding PGCs 821 are brought into conduction, outputs of the PLEs[00] to [09] are connected to an IO circuit (IO[00]) of the IOA 804. The circuit structure of the IO circuit is similar to that of the IO 50 (FIG. 13), and the IO circuit includes CM cells.

The MC-FPGA 800 includes a 7.52-kbit configuration memory to store configuration data. The MPG 820 includes a 6.08-kbit configuration memory; the PLE 830 includes a 1.28-kbit configuration memory; and the IO circuit includes a 0.16-kbit configuration memory.

<MPG>

Figure 19B:
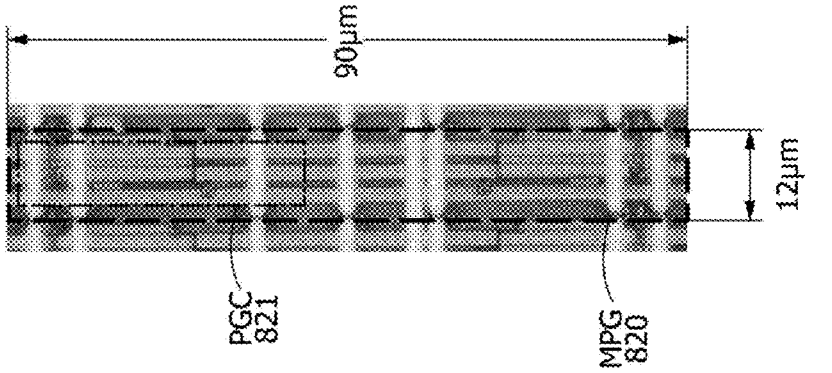
FIG. 19B is an optical micrograph of the routing switch (MPG)
Figure 19A:
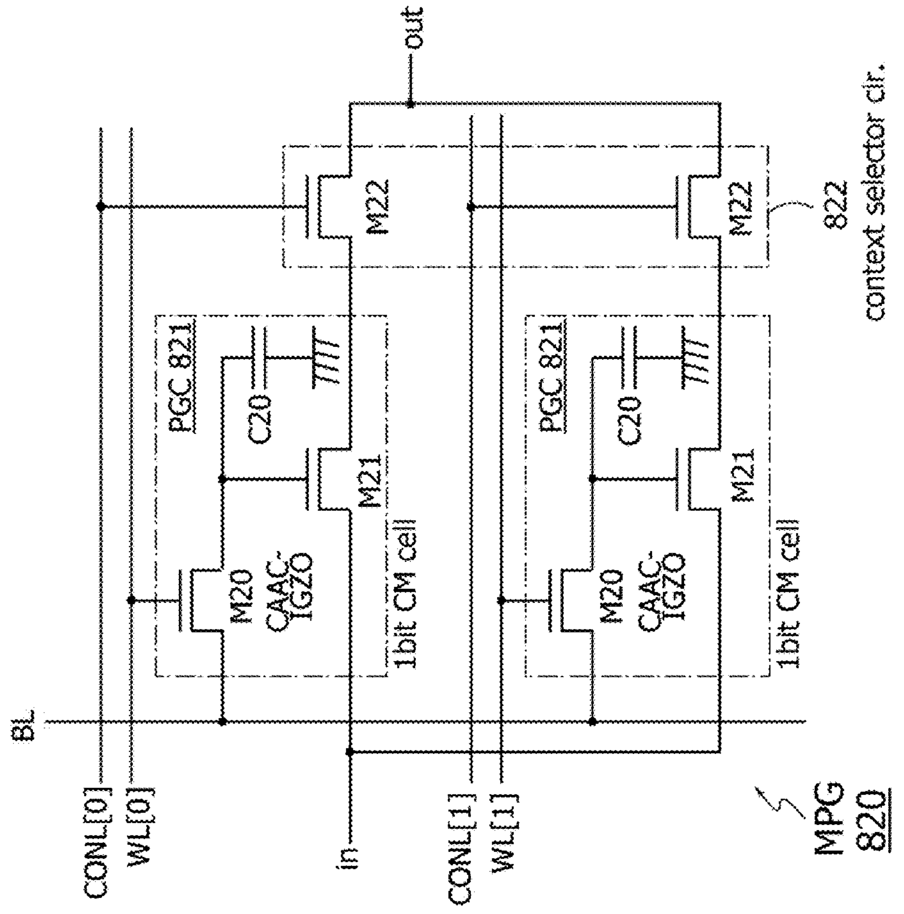
FIG. 19A is a circuit diagram of a routing switch (MPG)

FIG. 19A is a circuit diagram of the MPG 820. FIG. 19B is an optical micrograph of the MPG 820.

The circuit structure of the MPG 820 is similar to that of the SW 130 (FIG. 6). The MPG 820 includes two path gate circuits (PGCs) 821 and a context selector circuit 822. A wiring BL is connected to the bit driver circuit 802 and is supplied with a data signal written to the CM cell. A wiring WL is connected to the word driver circuit 803 and is supplied with a selection signal for selecting a configuration memory cell to which data is written.

The PGC 821 is a switch circuit and includes a 1-bit CM cell. The PGC 821 includes a transistor M20, a transistor M21, and a capacitor C20. The transistor M21 functions as a path transistor, and the conduction state of the transistor M21 is determined by voltage held in the capacitor C20. Context signals context[0] and context[1] are input to CONL[0] and CONL[1], respectively, and one of two transistors M22 in the context selector circuit 822 is turned on. Conduction between an input and an output of the MPG 820 is determined by the conduction state of the transistor M21 in the PGC 821 with configuration data and the conduction state of the transistor M22 in the context selector circuit 822 with context[1:0]. The PGC 821 can be regarded as a nonvolatile memory retaining data by holding a potential in the capacitor C20 and consumes almost no power for data retention.

The transistor M20 is a CAAC-IGZO FET. The channel length L/channel width W of the transistor M20 is 1 µm/4. The transistors M21 and M22 are Si transistors, and L/W of each transistor is 0.5 µm/15 µm. The capacitance of the capacitor C20 is 184 fF. The layout size of the MPG 820 is 90 µm×12 µm. The layout area of the MPG 820 can be reduced by 20% compared to the case of using an SRAM cell for the PGC 821.

A routing switch (MPG 820) includes the largest number of FPGAs. Thus, when a large FPGA employs the MPG 820 as a routing switch, area and power for data retention can be drastically reduced.

<PLE>

Figure 20A:
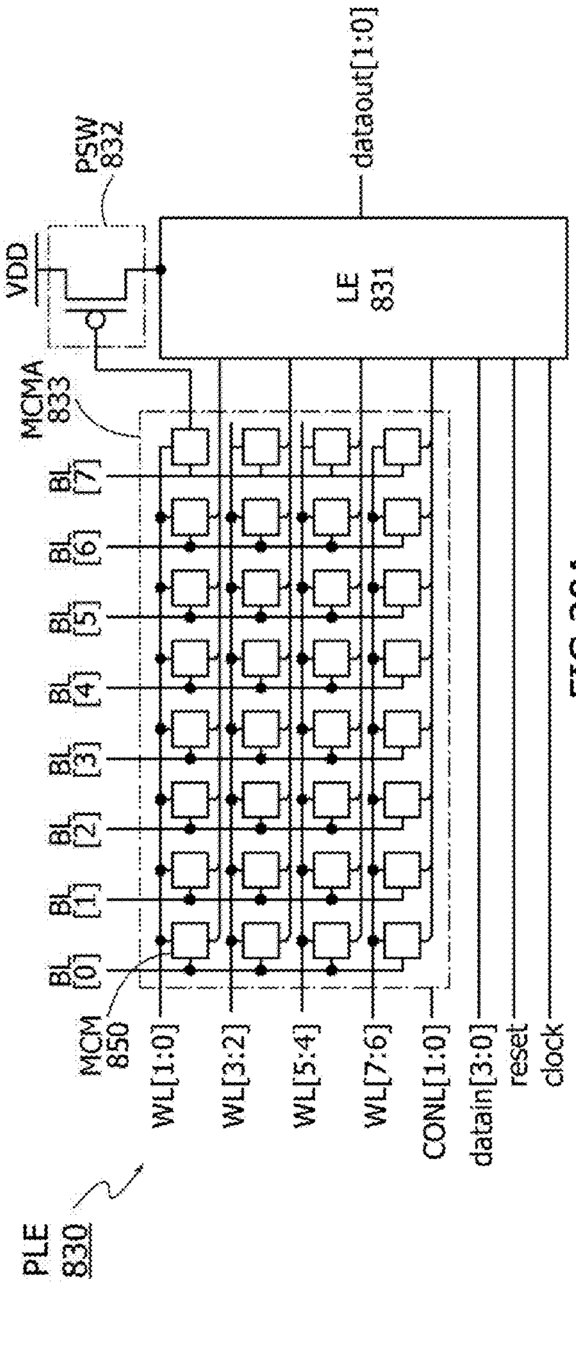
FIG. 20A is a circuit diagram of a programmable logic element (PLE)
Figure 20B:
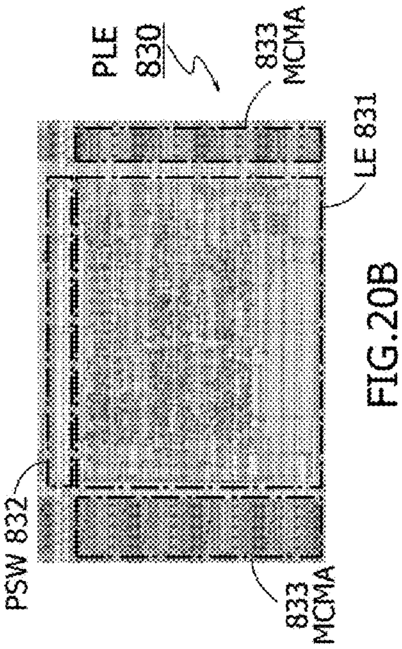
FIG. 20B is an optical micrograph of the programmable logic element (PLE)

FIG. 20A is a block diagram of the PLE 830. FIG. 20B is an optical micrograph of the PLE 830. The circuit structure of the PLE 830 is similar to that of the MLE 10 (FIG. 12). The PLE 830 includes a logic circuit (LE) 831, a power switch circuit (PSW) 832, and an MCM array (MCMA) 833.

Figure 21:
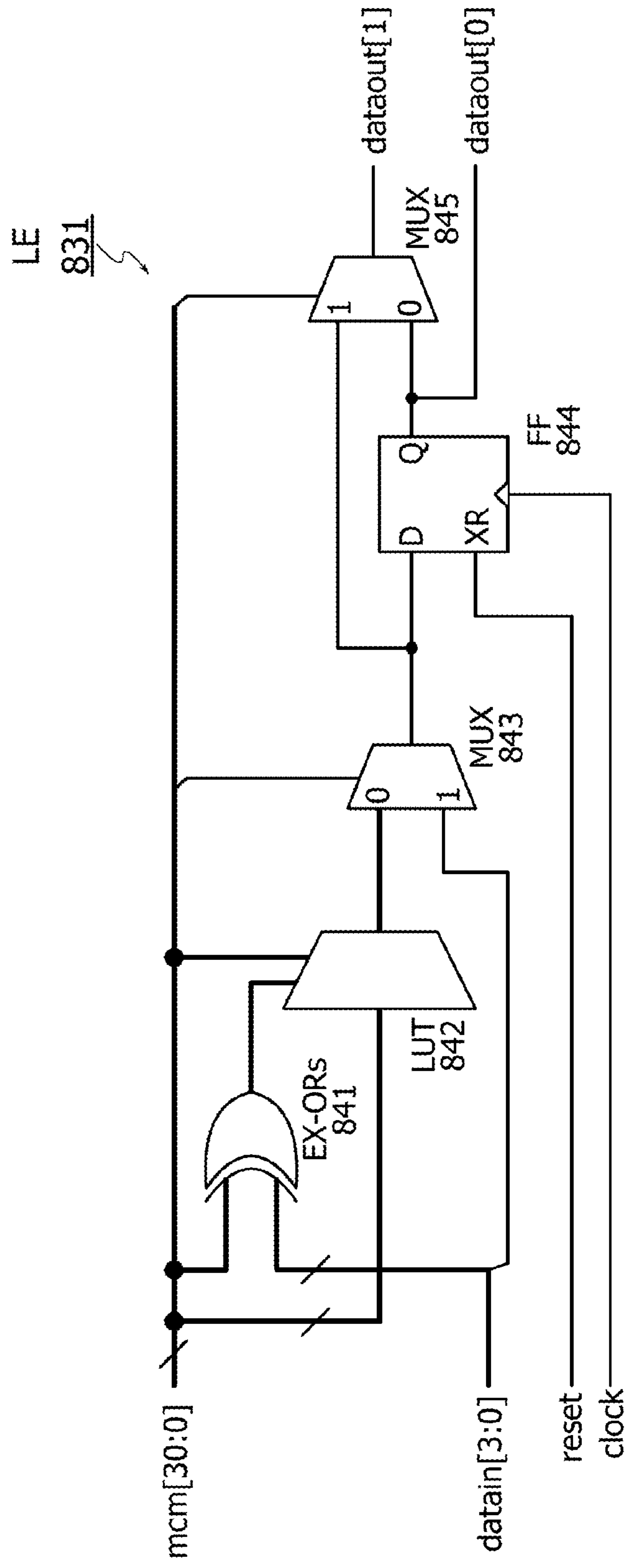
FIG. 21 is a circuit diagram of the LE.

FIG. 21 is a circuit diagram of the LE 831. The LE 831 corresponds to the logic element (LE) 11 in FIG. 12. The LE 831 has four inputs datain[3:0] and two outputs dataout[1:0] and includes a plurality of EX-OR circuits 841, a look-up table (LUT) 842, a multiplexer (MUX) 843, a flip-flop circuit (FF) 844, and an MUX 845. Outputs mcm[30:0] of thirty one MCMs 850, a clock signal clock, and a reset signal reset are input to the LE 831.

The MCMA 833 includes thirty two multi-configuration memories (MCM) 850 arranged in an array. Each of the MCMs 850 is connected to wirings BL and WL corresponding to the arrangement.

The PSW 832 controls supply of the power supply potential VDD to the LE 831, and the on/off state of the PSW 832 is controlled by an output potential of one MCM 850 included in the PLE 830. The fabricated MC-FPGA 800 performs power gating on the logic circuits (LEs) 831 excluding the MCM 850. By controlling the conduction of the PSW 832 provided in each PLE 830, fine-grained power gating can be performed in each PLE 830. The PSW 832 is a Si transistor, and L/W of the PSW 832 is 0.5 µm/4480 µm. Area overhead due to formation of the PSW 832 in the PLE 830 can be as small as 7.5%.

The power consumption due to a context switch is independent of the presence of power gating. Thus, substantial power overhead due to power gating is only energy for charging and discharging a gate potential of the PSW 832. In this manner, an MC-FPGA can easily have a fine-grained PG function.

In other words, the use of the PSW 832 facilitates formation of a multi-context FPGA that can perform fine-grained power gating.

<MCM>

Figure 22B:
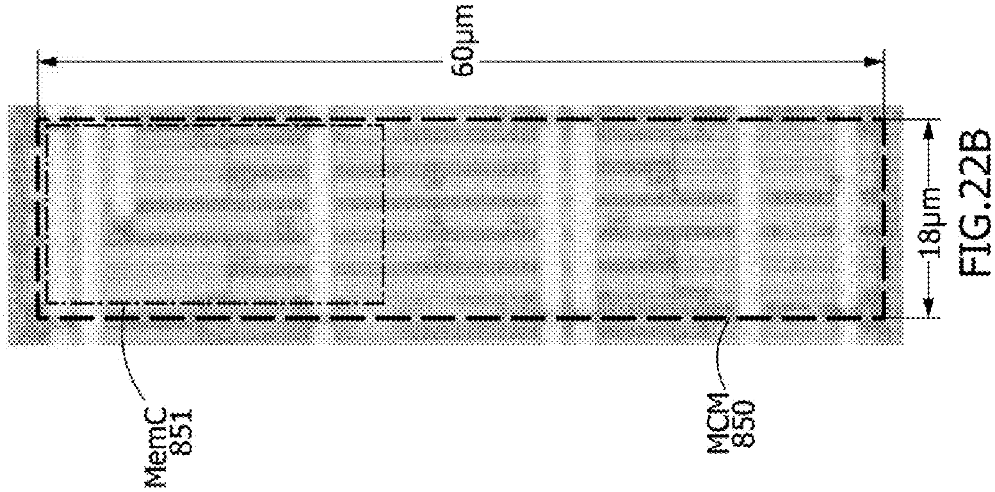
FIG. 22B is an optical micrograph of the multi-configuration memory (MCM)
Figure 22A:
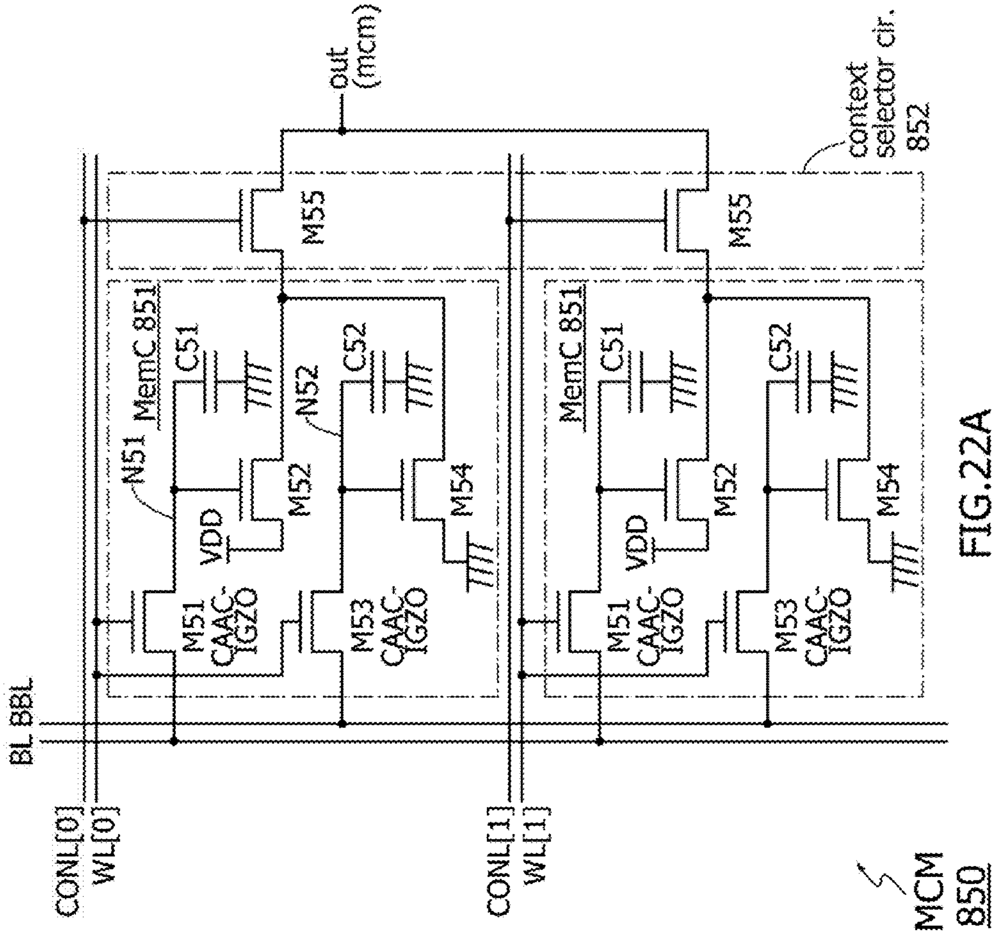
FIG. 22A is a circuit diagram of a multi-configuration memory (MCM)

FIG. 22A is a circuit diagram of the MCM 850. FIG. 22B is an optical micrograph of the MCM 850. The MCM 850 is a multi-context configuration memory and corresponds to the ME 121 (FIG. 5).

The circuit structure of the MCM 850 is similar to that of the ME 121. The MCM 850 includes two memory cells (MemCs) 851 and a context selector circuit 852. The MemC 851 has two 1-bit CM cells and includes transistors M51 to M54 and capacitors C51 and C52. A wiring BBL is supplied with an inversion signal of a data signal input to the wiring BL. In the MemC 851, the conduction state of the transistor M52 or M54 is determined by the potentials of nodes N51 and N52. By configuration, potentials having reverse levels are input to the nodes N51 and N52; thus, the output value of the MemC 851 is “0” or “1.” Context[0] and context[1] are input to CONL[0] and CONL[1], respectively, and one of two transistors M55 in the context selector circuit is turned on.

The transistors M51 and M53 are CAAC-IGZO FETs. The channel length L/channel width W of each transistor is 1 μm/4 μm. The transistors M52, M54, and M55 are Si transistors, and L/W of each transistor is 0.5 μm/15 μm. The capacitance of each of the capacitors C51 and C52 is 184 fF. The layout size of the MCM 850 is 60 μm×16 μm. Like the PGC 821, the MCM 850 retains data by holding potentials in the capacitors C51 and C52 and thus consumes almost no power for data retention.

<Standby Power>

The MC-FPGA 800 includes a 7.52-kbit CM cell to store configuration data. The MPG 820 includes a 6.08-kbit CM cell; the PLE 830 includes a 1.28-kbit CM cell; and the IO circuit includes a 0.16-kbit CM cell. In each of the MPG 820, the MCM 850, and the IO circuit, the CM cell does not need a write circuit that needs high voltage to write data, such as a flash memory, and, unlike an MRAM, does not need to supply high current. Thus, a driver circuit similar to that of an SRAM can be used.

The standby power of the CM cells and the driver circuits (including the driver circuits 802 and 803) of the MC-FPGA 800 at a drive voltage of 2.5 V is estimated to be 92 nW by SPICE simulation. On the other hand, the standby power of the MC-FPGA 800 including SRAM cells as the 1-bit CM cells (a comparison example) is estimated to be 534 nW. In other words, according to this example, the standby power of the MC-FPGA can be reduced by 82.8%. In the case of the MC-FPGA including SRAM cells, when the number of CM cells is increased, the power consumption of the CM cells becomes relatively high compared to the power consumption of the driver circuits. Accordingly, the MC-FPGA in this example is more advantageous in making the MC-FPGA large.

<Context Switch Operation>

Figure 23A:
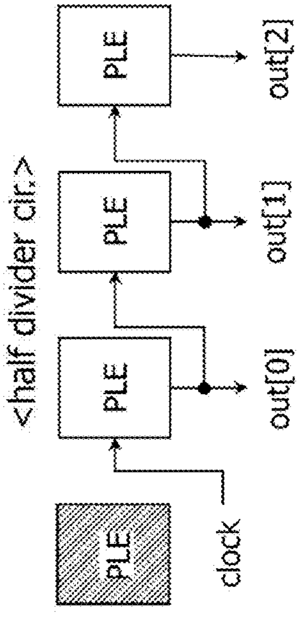
FIGS. 23A and 23B illustrate context switch operation.
Figure 23B:
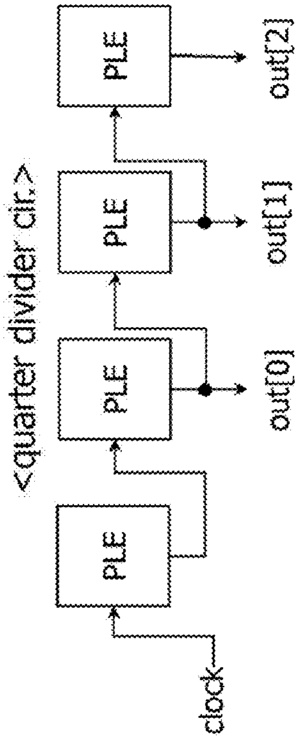
Figure 23C:
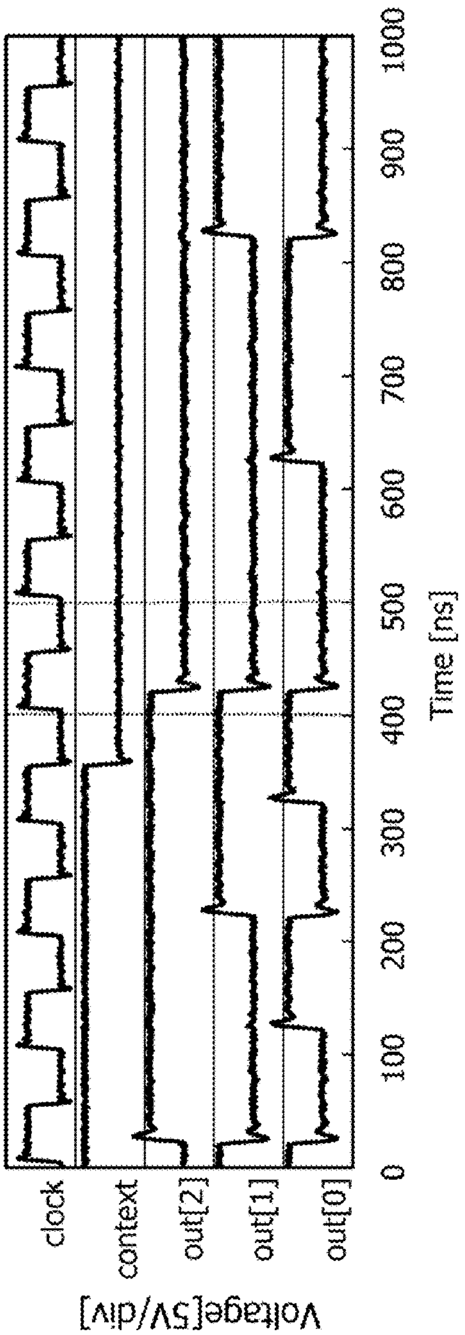
FIG. 23C illustrates signal waveforms in context switch operation.

The verification results of a context switch of the MC-FPGA 800 are described below with reference to FIGS. 23A to 23C. FIGS. 23A and 23B show reconfiguration of the MC-FPGA 800 by a context switch.

By a context switch, the structure of the MC-FPGA 800 is changed from a half divider including three PLEs into a quarter divider including four PLEs. FIG. 23C shows waveforms of output signals OUT[2:0] of the divider, the clock signal clock, and a context switch signal context input from the outside. Power supply voltage is 2.5 V and clock frequency is 10 MHz. Note that out[0] corresponds to a least significant bit (LSB).

At time 0 ns, the structure of the MC-FPGA 800 is a half divider. At time 355 ns, the context (external input signal) is changed. At time 400 ns, in synchronization with a clock rise, internal signals context[1:0] are changed to start context switch operation. At time 500 ns, out[0] is not counted up; thus, the structure of the MC-FPGA 800 is a quarter divider. After the time 500 ns, the MC-FPGA 800 operates as the quarter divider. In other words, FIG. 23C indicates that reconfiguration of the MC-FPGA 800 is performed within one clock cycle after context[1:0] are changed.

The power reduction effect by fine-grained power gating (PG) is described below.

<Reduction in Power Consumption>

Figure 24B:
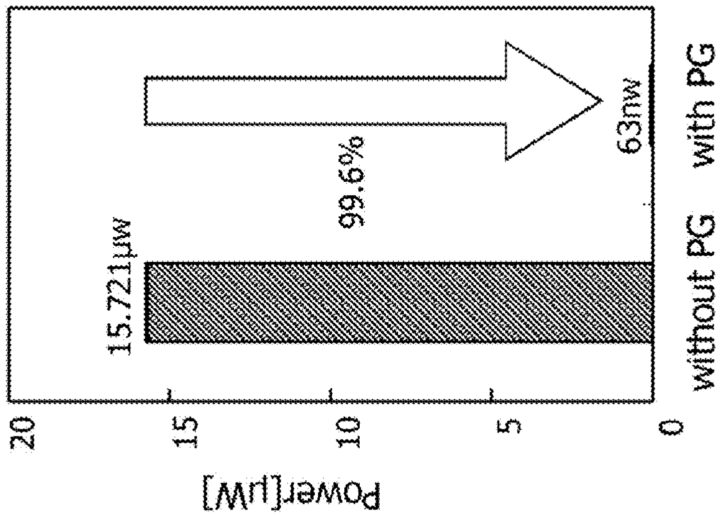
FIG. 24B is a graph showing the power consumption of the PLEs calculated from data in FIG. 24A.
Figure 24A:
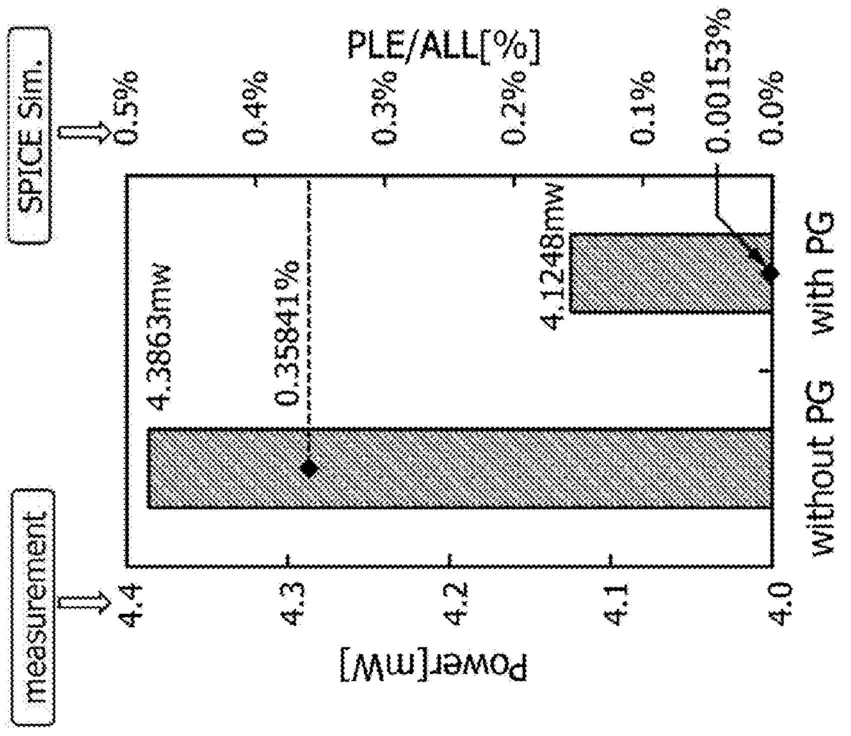
FIG. 24A is a graph showing power consumption (measured value) of the MC-FPGA and a ratio (calculation) of the power consumption of the PLEs to the power consumption of the MC-FPGA.

The total power consumption of the MC-FPGA 800 with the following structures is measured. In a structure with power gating, five shift registers are composed of five PLEs 830 among twenty PLEs 830, and power gating is performed on fifteen non-active PLEs (NA PLEs) 830. In a structure without power gating, five shift registers are composed of five PLEs 830 among twenty PLEs 830, and power gating is not performed on fifteen NA PLEs 830. Note that input signals of the NA PLEs are fixed to ground potentials by configuration data. The total power consumption of the MC-FPGA 800 is measured in an operating condition that pulse signals are circulated in five shift registers at a power supply voltage of 2.5 V and a clock frequency of 10 MHz. Further, the ratio of the power consumption of the non-active PLEs 830 to the total power consumption of the MC-FPGA 800 is estimated by SPICE simulation in the same conditions. FIG. 24A shows the results. The power consumption of the MC-FPGA 800 in the structure without power gating is 4.3863 mW. The ratio of the power consumption of the PLEs 830 to the total power consumption of the MC-FPGA 800 in the structure without power gating is 0.35841%. The power consumption of the MC-FPGA 800 in the structure with power gating is 4.1248 mW. The ratio of the power consumption of the PLEs 830 to the total power consumption of the MC-FPGA 800 in the structure with power gating is 0.00153%.

By multiplying the total power consumption of the MC-FPGA 800 (measured value) by the ratio (calculation) of the power consumption of the non-active PLEs 830 to the total power consumption of the MC-FPGA 800, the power consumption of the non-active PLEs 830 is estimated. The power consumption corresponds to the power consumption of the PLEs 830 in a power-off state (standby state). FIG. 24B shows the results.

The power consumptions of the PLEs 830 in the structures without and with power gating are 15.721 μW and 63 nW, respectively. In other words, FIG. 24B indicates that fine-grained power gating can reduce the power consumption of the PLEs 830 in the standby state by 15.658 μW (99.6%). Note that the reason why the PLEs 830 in the power-off state in the structure with power gating consume a power of 63 nW is that leakage current is caused by the PSW 832 and the MCM 850.

<Power Overhead and Break-Even Time>

Figure 25A:
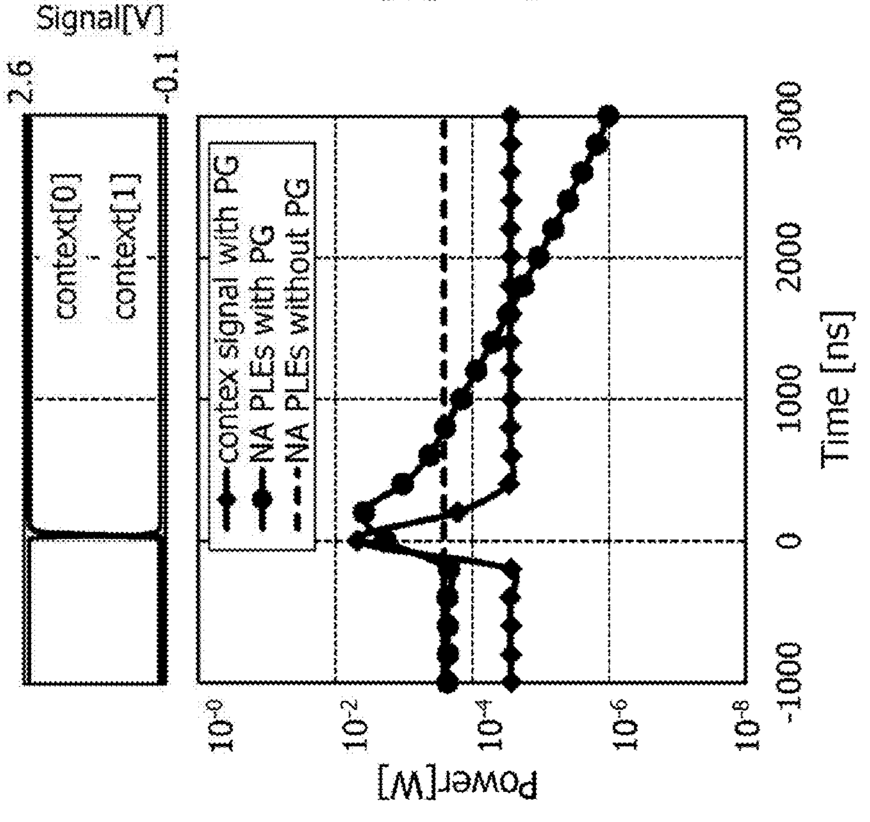
FIGS. 25A and 25B are graphs showing time changes in power consumption of non-active PLEs due to power gating through calculation.
Figure 25B:
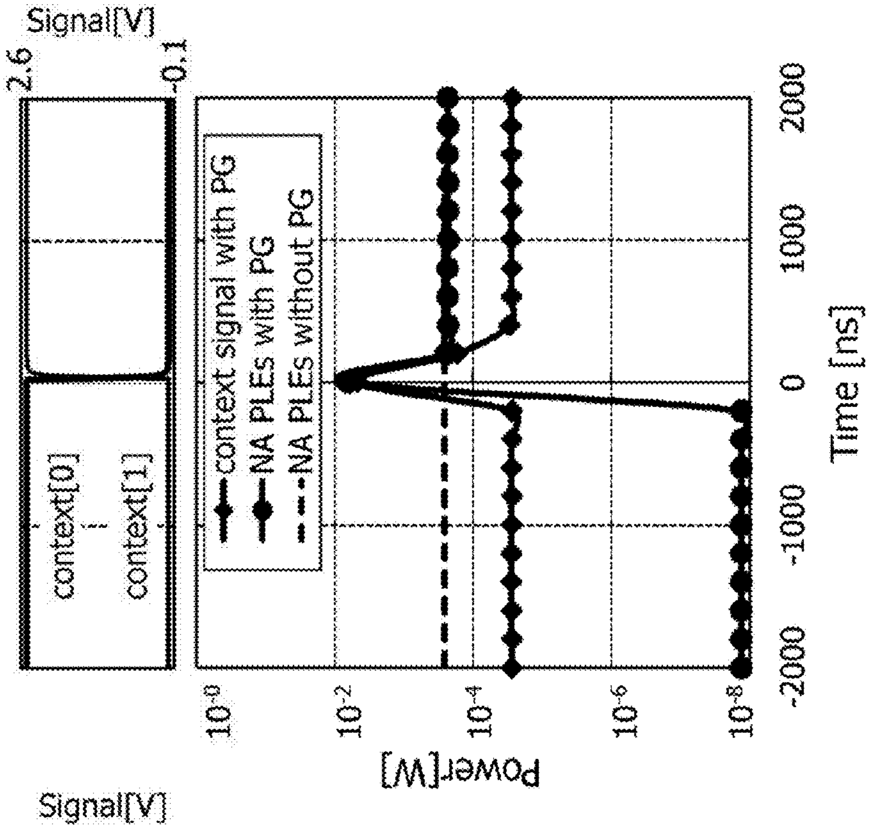

In order to obtain power overhead due to power gating, power for power gating is estimated by SPICE simulation in the above circuit structures and operating condition. FIGS. 25A and 25B show the results. The main factor for the power overhead is power for controlling context[1:0] and the PSW 832.

FIGS. 25A and 25B show waveforms of the context signals context[1:0] and time changes in power consumption due to a context switch and power consumption of NA PLEs (with and without PG). FIG. 25A shows time changes in power consumption in the case of changing the PLEs 830 from a power-on state into a power-off state by a context switch. When context[0] is changed from a low level into a high level, the PSW 832 is changed from a conduction state into a non-conduction state. FIG. 25B shows time changes in power consumption in the case of changing the PLEs 830 from a power-off state to a power-on state by a context switch. When context[0] is changed from a high level into a low level, the PSW 832 is changed from a non-conduction state into a conduction state.

Here, whether the power on/off is completed is determined by the conduction state of the PSW 832. Power-on means a state in which off-state current is higher than or equal to 10 mA when the gate voltage of the PSW 832 is 0.25 V. Power-off means a state in which off-state current is lower than or equal to 110 nA when the gate voltage of the PSW 832 is 2.25 V.

Note that in the following description, power overheads obtained by calculation results in FIGS. 25A and 25B are referred to as power overhead in power-off and power overhead in power-on, respectively.

Each data point in FIGS. 25A and 25B represents 200 ns average power. At time 0 ns, context[1:0] start to change. The time from the start of change in context[1:0] to power on/off is 90 ns/700 ns. The time for power-off is longer than the time for power-on. However, the time for power-off can be shortened by the structure of the MCM 850 and can be optimized by a tradeoff with the total power consumption of the MC-FPGA 800 due to power gating. Configuration data ensures that signals output from NA PLEs subjected to power gating are not used in other active PLEs; thus, even if the time for power-off is finite, it does not affect the circuit operation of the MC-FPGA 800.

Power overhead due to power on/off is 2.25 nJ/2.26 nJ. Specifically, power for controlling context[1:0] is 0.98 nJ/0.99 nJ, and power for controlling the NA PLEs is 1.27 nJ/1.2 7 nJ. The standby power of the NA PLEs is 232 µW. From the results, break-even time (BET) is estimated to be 19.4 µs. The BET is time at which power overhead with power gating due to power on/off required to control context[1:0] and the NA PLEs becomes equal to the power consumption (standby power) of the NA PLEs without power gating.

When the number of NA PLEs subjected to power gating is 1, 5, or 10, the BET can be estimated to be 138.2 µs, 36.4 µs, or 23.7 µs. As the number of NA PLEs subjected to power gating becomes larger, the rate of power for controlling context[1:0] in power overhead can decrease because the power for controlling context[1:0] is fixed regardless of the number of PLEs; thus, the BET can become shorter.

As described above, according to this example, a multi-context FPGA that can perform fine-grained power gating can reduce power consumption and area.

This example can be combined with any of the above embodiments as appropriate.

This application is based on Japanese Patent Application serial No. 2012-266911 filed with Japan Patent Office on Dec. 6, 2012 and Japanese Patent Application serial No. 2013-189029 filed with Japan Patent Office on Sep. 12, 2013, the entire contents of which are hereby incorporated by reference.

What is claimed is:

1. A semiconductor device comprising:
a power supply line;
a logic element;
a switch; and
a first configuration memory,
wherein a first terminal of the switch is electrically connected to the power supply line,
wherein a second terminal of the switch is electrically connected to the logic element, and
wherein a gate of the switch is electrically connected to the first configuration memory,
wherein the first configuration memory comprises a first transistor and a second transistor,
wherein a first terminal of the first transistor is electrically connected to a gate of the second transistor, and
wherein a first terminal of the second transistor is electrically connected to the gate of the switch.

2. The semiconductor device according to claim 1,
wherein the first transistor comprises a channel formation region comprising an oxide semiconductor.

3. The semiconductor device according to claim 2,
wherein the switch is configured to control supply of power from the power supply line to the logic element.

4. The semiconductor device according to claim 3,
wherein the first configuration memory is configured to store first configuration data and output a first signal corresponding to the first configuration data so that power or no power is supplied from the power supply line to the logic element through the switch.

5. The semiconductor device according to claim 1,
wherein the first configuration memory comprises a first memory cell and a second memory cell,
wherein each of the first memory cell and the second memory cell comprises a first transistor, a second transistor, and a third transistor,
wherein a first terminal of the first transistor is electrically connected to a gate of the second transistor,
wherein a first terminal of the second transistor is electrically connected to a first terminal of the third transistor,
wherein a second terminal of the third transistor is electrically connected to the gate of the switch, and
wherein the first transistor comprises a channel formation region comprising an oxide semiconductor.

6. The semiconductor device according to claim 5,
wherein the switch is configured to control supply of power from the power supply line to the logic element,
wherein the first memory cell is configured to store first configuration data and output a first signal corresponding to the first configuration data so that power is supplied from the power supply line to the logic element through the switch, and
wherein the second memory cell is configured to store second configuration data and output a second signal corresponding to the second configuration data so that no power is supplied from the power supply line to the logic element through the switch.

7. The semiconductor device according to claim 1, further comprising a second configuration memory,
wherein the second configuration memory is configured to store second configuration data, and
wherein a function of the logic element is changed in accordance with the second configuration data.

8. A semiconductor device comprising:
a power supply line;
a first logic element;
a second logic element;
a first switch;
a second switch;
a first configuration memory; and
a second configuration memory,
wherein a first terminal of the first switch is electrically connected to the power supply line,
wherein a second terminal of the first switch is electrically connected to the first logic element,
wherein a gate of the first switch is electrically connected to the first configuration memory,
wherein a first terminal of the second switch is electrically connected to the power supply line,
wherein a second terminal of the second switch is electrically connected to the second logic element, and
wherein a gate of the second switch is electrically connected to the second configuration memory, wherein each of the first configuration memory and the second configuration memory comprises a first transistor and a second transistor, wherein a first terminal of the first transistor is electrically connected to a gate of the second transistor, wherein a first terminal of the second transistor of the first configuration memory is electrically connected to the gate of the first switch, and wherein a first terminal of the second transistor of the second configuration memory is electrically connected to the gate of the second switch.

9. The semiconductor device according to claim 8, wherein the first transistor comprises a channel formation region comprising an oxide semiconductor.

10. The semiconductor device according to claim 9, wherein the first switch is configured to control supply of power from the power supply line to the first logic element, and wherein the second switch is configured to control supply of power from the power supply line to the second logic element.

11. The semiconductor device according to claim 10, wherein the first configuration memory is configured to store first configuration data and output a first signal corresponding to the first configuration data so that power is supplied from the power supply line to the first logic element through the first switch, and wherein the second configuration memory is configured to store second configuration data and output a second signal corresponding to the second configuration data so that no power is supplied from the power supply line to the second logic element through the second switch.

12. The semiconductor device according to claim 8, wherein the first configuration memory comprises a first memory cell and a second memory cell, wherein the second configuration memory comprises a third memory cell and a fourth memory cell, wherein each of the first memory cell, the second memory cell, the third memory cell, and the fourth memory cell comprises a first transistor, a second transistor, and a third transistor, wherein a first terminal of the first transistor is electrically connected to a gate of the second transistor, wherein a first terminal of the second transistor is electrically connected to a first terminal of the third transistor, wherein a second terminal of the third transistor of each of the first memory cell and the second memory cell is electrically connected to the gate of the first switch, wherein a second terminal of the third transistor of each of the third memory cell and the fourth memory cell is electrically connected to the gate of the second switch, and wherein the first transistor comprises a channel formation region comprising an oxide semiconductor.

13. The semiconductor device according to claim 12, wherein the first switch is configured to control supply of power from the power supply line to the first logic element, wherein the second switch is configured to control supply of power from the power supply line to the second logic element, wherein the first memory cell is configured to store first configuration data and output a first signal corresponding to the first configuration data so that power is supplied from the power supply line to the first logic element through the first switch, wherein the second memory cell is configured to store second configuration data and output a second signal corresponding to the second configuration data so that no power is supplied from the power supply line to the first logic element through the first switch, wherein the third memory cell is configured to store third configuration data and output a third signal corresponding to the third configuration data so that power is supplied from the power supply line to the second logic element through the second switch, and wherein the fourth memory cell is configured to store fourth configuration data and output a fourth signal corresponding to the fourth configuration data so that no power is supplied from the power supply line to the second logic element through the second switch.

14. The semiconductor device according to claim 8, further comprising a third configuration memory and a fourth configuration memory, wherein the third configuration memory is configured to store third configuration data, wherein a function of the first logic element is changed in accordance with the third configuration data, wherein the fourth configuration memory is configured to store fourth configuration data, and wherein a function of the second logic element is changed in accordance with the fourth configuration data.

15. A semiconductor device comprising:

a power supply line;

a first logic element;

a second logic element;

a first switch;

a second switch;

a third switch;

a first configuration memory;

a second configuration memory; and a third configuration memory, wherein a first terminal of the first switch is electrically connected to the power supply line, wherein a second terminal of the first switch is electrically connected to the first logic element, wherein a gate of the first switch is electrically connected to the first configuration memory, wherein a first terminal of the second switch is electrically connected to the power supply line, wherein a second terminal of the second switch is electrically connected to the second logic element, wherein a gate of the second switch is electrically connected to the second configuration memory, wherein a first terminal of the third switch is electrically connected to the first logic element, wherein a second terminal of the third switch is electrically connected to the second logic element, and wherein a gate of the third switch is electrically connected to the third configuration memory.

16. The semiconductor device according to claim 15, wherein each of the first configuration memory, the second configuration memory, and the third configuration memory comprises a first transistor and a second transistor, wherein a first terminal of the first transistor is electrically connected to a gate of the second transistor, wherein a first terminal of the second transistor of the first configuration memory is electrically connected to the gate of the first switch, wherein a first terminal of the second transistor of the second configuration memory is electrically connected to the gate of the second switch, wherein a first terminal of the second transistor of the third configuration memory is electrically connected to the gate of the third switch, and wherein the first transistor comprises a channel formation region comprising an oxide semiconductor.

17. The semiconductor device according to claim 16, wherein the first switch is configured to control supply of power from the power supply line to the first logic element, wherein the second switch is configured to control supply of power from the power supply line to the second logic element, and wherein the third switch is configured to control conduction between the first logic element and the second logic element.

18. The semiconductor device according to claim 17, wherein the first configuration memory is configured to store first configuration data and output a first signal corresponding to the first configuration data so that power is supplied from the power supply line to the first logic element through the first switch, wherein the second configuration memory is configured to store second configuration data and output a second signal corresponding to the second configuration data so that no power is supplied from the power supply line to the second logic element through the second switch, and wherein the third configuration memory is configured to store third configuration data and output a third signal corresponding to the third configuration data so that conduction between the first logic element and the second logic element is determined.

19. The semiconductor device according to claim 15, wherein the first configuration memory comprises a first memory cell and a second memory cell, wherein the second configuration memory comprises a third memory cell and a fourth memory cell, wherein the third configuration memory comprises a fifth memory cell and a sixth memory cell, wherein each of the first memory cell, the second memory cell, the third memory cell, the fourth memory cell, the fifth memory cell, and the sixth memory cell comprises a first transistor, a second transistor, and a third transistor, wherein a first terminal of the first transistor is electrically connected to a gate of the second transistor, wherein a first terminal of the second transistor is electrically connected to a first terminal of the third transistor, wherein a second terminal of the third transistor of each of the first memory cell and the second memory cell is electrically connected to the gate of the first switch, wherein a second terminal of the third transistor of each of the third memory cell and the fourth memory cell is electrically connected to the gate of the second switch, wherein a second terminal of the second transistor of each of the fifth memory cell and the sixth memory cell is electrically connected to the first logic element, wherein a second terminal of the third transistor of each of the fifth memory cell and the sixth memory cell is electrically connected to the second logic element, and wherein the first transistor comprises a channel formation region comprising an oxide semiconductor.

20. The semiconductor device according to claim 19, wherein the first switch is configured to control supply of power from the power supply line to the first logic element, wherein the second switch is configured to control supply of power from the power supply line to the second logic element, and wherein the third switch is configured to control conduction between the first logic element and the second logic element.

* * * * *